United States Patent [19]
Kimata

[11] Patent Number: 5,986,484
[45] Date of Patent: Nov. 16, 1999

[54] SEMICONDUCTOR DEVICE DRIVE CIRCUIT WITH VOLTAGE SURGE SUPPRESSION

[75] Inventor: Masahiro Kimata, Tokyo, Japan

[73] Assignee: Mitsubishi Denki Kabushiki Kaisha, Tokyo, Japan

[21] Appl. No.: 08/887,082

[22] Filed: Jul. 2, 1997

[30] Foreign Application Priority Data

Jul. 5, 1996 [JP] Japan ................................ 8-176475

[51] Int. Cl.⁶ .................................................. H03K 3/00
[52] U.S. Cl. ............................ 327/108; 323/908; 361/56
[58] Field of Search ........................ 327/108–112, 434, 327/436, 437; 323/284, 285, 908; 361/18, 56, 91

[56] References Cited

U.S. PATENT DOCUMENTS

| | | | |
|---|---|---|---|
| Re. 34,107 | 10/1992 | Wirth ........................................ | 323/908 |
| 5,055,721 | 10/1991 | Majumdar et al. ...................... | 327/434 |
| 5,099,138 | 3/1992 | Fukunaga ................................ | 327/109 |
| 5,408,150 | 4/1995 | Wilcox .................................... | 327/108 |
| 5,627,460 | 5/1997 | Bazinet .................................... | 323/224 |
| 5,710,508 | 1/1998 | Watanabe ................................ | 323/284 |
| 5,744,878 | 4/1998 | Watchter et al. ........................ | 327/111 |

FOREIGN PATENT DOCUMENTS

| | | |
|---|---|---|
| 5-328746 | 12/1993 | Japan . |
| 5-336732 | 12/1993 | Japan . |
| 9-65644 | 3/1997 | Japan . |

*Primary Examiner*—Kenneth B. Wells
*Attorney, Agent, or Firm*—Oblon, Spivak, McClelland, Maier & Neustadt, P.C.

[57] ABSTRACT

A semiconductor device drive circuit comprises first drive means for driving an IGBT, second drive means for driving the IGBT at lower speed than the first drive means, switch means for switching output of the first drive means and output of the second drive means for supply to a gate of the IGBT, and current decrease start point detection means for detecting a current decrease start point when a transition is made from a first period in which change in a collector current is moderate to a second period in which change in the collector current is abrupt when the IGBT is turned off. The switch means is operated so as to use the first drive means in the first period and the second drive means in the second period in response to output of the current decrease start point detection means.

14 Claims, 18 Drawing Sheets

SEMICONDUCTOR DEVICE DRIVE CIRCUIT WITH VOLTAGE SURGE SUPPRESSION

BACKGROUND OF THE INVENTION

This invention relates to a gate drive circuit of an IGBT (Insulated Gate Bipolar Transistor which is an insulated gate self-extinction elements) of a switching semiconductor device and in particular to a gate drive circuit which enables suppression of a voltage surge during the turn-off operation and a decrease in a switching loss.

FIG. 18 is a block diagram to show a semiconductor device drive circuit described in Unexamined Japanese Patent Publication 5-328746, for example. In the figure, numeral 1 is an insulated gate bipolar transistor for controlling the conduction state between main electrodes in response to a voltage applied to a control electrode, numeral 1a is a control electrode, numeral 1b is a first main electrode, and numeral 1c is a second main electrode. For simplicity, the insulated gate bipolar transistor 1 will be hereinafter referred as the IGBT 1, the control electrode 1a called the gate 1a, the first main electrode 1b called the collector 1b, and the second main electrode 1c called the emitter 1c. Numeral 2 is an on-DC voltage source for supplying a voltage to turn on the IGBT 1, numeral 3 is an off-DC voltage source for supplying a voltage to turn off the IGBT 1, numeral 4 is switching signal generation means for generating a signal for turning on/off the IGBT 1, numeral 5 is on/off switch means for switching the on-DC voltage source 2 and the off-DC voltage source 3 in response to output of the switching signal generation means 4 for applying a voltage to the gate 1a of the IGBT 1, and numeral 6 is gate resistor switch means for switching gate resistors. The gate resistor switch means 6 is made up of a resistor 9, a resistor 10, and switch means 11. Numeral 7 is current detection means for detecting an electric current flowing into the IGBT 1 and numeral 8 is control means for controlling the gate resistor switch means 6 in response to output of the current detection means 7.

FIG. 19 is a flowchart to show a control method of the control means 8. In the control method, the control means 8 determines whether or not the conduction current is smaller than a reference current value based on output of the current detection means 7 for detecting the conduction current of the IGBT 1. If the control means 8 determines that the conduction current is smaller than the reference current value, it outputs a signal for switching the gate resistor so that the resistance value increases, and terminates the process. If the control means 8 does not determine that the conduction current is smaller than the reference current value, it does not output a signal for switching the gate resistor so that the resistance value increases, and terminates the process.

Next, the operation will be discussed with reference to FIGS. 18 to 21. When the switching signal generation means 4 outputs an on-signal, the on/off switch means 5 switches to the on-DC voltage source 2 for applying an on-voltage via the gate resistor switch means 6 to the gate 1a of the IGBT 1, turning on the IGBT 1. When the IGBT 1 is on, the current detection means 7 detects a conduction current of the IGBT 1 and the control means 8 determines whether or not the detected conduction current value is smaller than a given reference current value. If the control means 8 determines that the conduction current value is smaller than the reference current value, it supplies a resistor switch signal to the gate resistor switch means 6 for switching the switch means 11 so that the resistance value of the gate resistor increases. Specifically, the switch means 11 which is short-circuited is opened for using only the resistor 9 as the gate resistor. Next, when the switching signal generation means 4 outputs an off signal, the on/off switch means 5 switches to the off-DC voltage source 3 for applying an off-voltage via the gate resistor switch means 6 to the gate 1a of the IGBT 1, turning off the IGBT 1. At this time, since the switch means 11 is open, the turn-off operation is performed only with the resistor 9. If the control means 8 determines that the conduction current value is larger than the reference current value, the switch means 11 remains short-circuited and the resultant resistance of the resistors 9 and 10 is used as the gate resistor. Since the resistors 9 and 10 are connected in parallel, the resultant resistance becomes smaller than the resistance value of the resistor 9. Therefore, according to the operation, the gate resistance increases only if the conduction current value is smaller than the reference current value.

FIGS. 20A and 20B are waveform charts to show the effect of the gate resistance magnitude on the switching waveform when the IGBT 1 is turned off. It shows collector current Ic of conduction current of the IGBT 1, collector-to-emitter voltage Vce of the IGBT 1, and switching loss P of the IGBT 1. FIG. 20A shows the effect when the gate resistance is small and FIG. 20B shows the effect when the gate resistance is large. The larger the gate resistance, the more moderate the decrease rate of the collector current Ic when the IGBT is turned off. Thus, the collector-emitter voltage surge caused by applying the decrease rate of the collector current Ic to wiring inductance is decreased. However, the increase rate of the collector-to-emitter voltage Vce also becomes moderate at the same time, thus the switching loss P represented by the multiplication integral value of the collector current Ic and the collector-to-emitter voltage Vce is increased. Thus, the voltage surge can be suppressed by increasing the gate resistance value, but the switching loss is increased accordingly.

Here, the turn-off characteristic of the IGBT 1 will be considered. Fall time tf of the time between the collector current Ic starting to decrease and stopping decreasing when the IGBT 1 is turned off depends on the collector current Ic and has an increasing function characteristic with Ic, as shown in FIG. 21. In the large current region, the fall time tf is prolonged because of the device characteristic and the current decrease rate represented by (collector current/fall time) lessens as a logical consequence, thus the voltage surge does not cause a problem. In contrast, in the small current region, the fall time tf is shortened and the voltage surge increases, thus decrease countermeasures become necessary. Therefore, only when the conduction current is in the small current region, the gate resistance value is increased and the fall time tf is prolonged, whereby the voltage surge can be suppressed. At this time, the gate resistance value is lessened in the large current region, so that the switching loss is not increased.

The conventional semiconductor device drive circuit is thus configured and assumes the device characteristic of the IGBT with the fall time increasing with an increase in the collector current, thus can be applied only to specific devices. With the conventional semiconductor device drive circuit, the minimum value of the gate resistance is determined to suppress the voltage surge, thus the gate resistance cannot be lessened exceeding the limit of the voltage surge. As a result, measures of lessening the gate resistance for decreasing the switching loss cannot effectively be taken.

SUMMARY OF THE INVENTION

It is therefore an object of the invention to provide a semiconductor device drive circuit which enables both suppression of a voltage surge and a decrease in a switching loss and can be applied to every IGBT.

According to a first aspect of the invention, there is provided a semiconductor device drive circuit being connected to a control electrode of an insulated gate bipolar transistor for controlling a conduction state between main electrodes in response to a voltage applied to the control electrode, the semiconductor device drive circuit comprising first drive means for driving the insulated gate bipolar transistor, second drive means for driving the insulated gate bipolar transistor at lower speed than the first drive means, switching signal generation means for supplying a signal to the first drive means and the second drive means, switch means for switching output of the first drive means and output of the second drive means for supply to the control electrode, and current decrease start point detection means for detecting a current decrease start point when a transition is made from a first period in which change in a current flowing into the main electrodes is moderate to a second period in which current change is abrupt when a voltage of the control electrode is lowered for making a transition from a conduction state to a non-conduction state between the main electrodes, characterized in that the switch means is operated so as to use the first drive means in the first period and the second drive means in the second period in response to output of the current decrease start point detection means.

According to a second aspect of the invention, there is provided a semiconductor device drive circuit being connected to a control electrode of an insulated gate bipolar transistor for controlling a conduction state between main electrodes in response to a voltage applied to the control electrode, the semiconductor device drive circuit comprising an on-DC voltage source for supplying an on voltage to the control electrode, an off-DC voltage source for supplying an off voltage to the control electrode, on/off switch means for switching the on-DC voltage source and the off-DC voltage source, switching signal generation means for supplying a signal to the on/off switch means, a first gate resistor being connected to the on/off switch means, a second gate resistor being connected to the on/off switch means and having a resistance value larger than the first gate resistor, switch means for switching the first gate resistor and the second gate resistor for connection to the control electrode, and current decrease start point detection means for detecting a current decrease start point when a transition is made from a first period in which change in a current flowing into the main electrodes is moderate to a second period in which current change is abrupt when a voltage of the control electrode is lowered for making a transition from a conduction state to a non-conduction state between the main electrodes, characterized in that the switch means is operated so as to use the first gate resistor in the first period and the second gate resistor in the second period in response to output of the current decrease start point detection means.

According to a third aspect of the invention, there is provided a semiconductor device drive circuit being connected to a control electrode of an insulated gate bipolar transistor for controlling a conduction state between main electrodes in response to a voltage applied to the control electrode, the semiconductor device drive circuit comprising an on-DC voltage source for supplying an on voltage to the control electrode, a first off-DC voltage source for supplying an off voltage to the control electrode, a second off-DC voltage source for supplying an off voltage to the control electrode and having a voltage smaller than the first off-DC voltage source, switch means for switching the first off-DC voltage source and the second off-DC voltage source, on/off switch means for switching the on-DC voltage source and output of the first switch means, switching signal generation means for supplying a signal to the on/off switch means, a gate resistor being connected between the on/off switch means and the control electrode, and current decrease start point detection means for detecting a current decrease start point when a transition is made from a first period in which change in a current flowing into the main electrodes is moderate to a second period in which current change is abrupt when a voltage of the control electrode is lowered for making a transition from a conduction state to a non-conduction state between the main electrodes, characterized in that the switch means is operated so as to use the first off-DC voltage source in the first period and the second off-DC voltage source in the second period in response to output of the current decrease start point detection means.

According to a fourth aspect of the invention, there is provided a semiconductor device drive circuit being connected to a control electrode of an insulated gate bipolar transistor for controlling a conduction state between main electrodes in response to a voltage applied to the control electrode, the semiconductor device drive circuit comprising an on-DC source for causing a current to flow into the control electrode, a first off-DC source for drawing out a current from the control electrode, a second off-DC source for drawing out a current from the control electrode and having a current value smaller than the first off-DC source, switch means for switching the first off-DC source and the second off-DC source, on/off switch means for switching output of the on-DC source and output of the first switch means, switching signal generation means for supplying a signal to the on/off switch means, and current decrease start point detection means for detecting a current decrease start point when a transition is made from a first period in which change in a current flowing into the main electrodes is moderate to a second period in which current change is abrupt when a voltage of the control electrode is lowered for making a transition from a conduction state to a non-conduction state between the main electrodes, characterized in that the switch means is operated so as to use the first off-DC source in the first period and the second off-DC source in the second period in response to output of the current decrease start point detection means.

According to a fifth aspect of the invention, there is provided a semiconductor device drive circuit being connected to a control electrode of an insulated gate bipolar transistor for controlling a conduction state between main electrodes in response to a voltage applied to the control electrode, the semiconductor device drive circuit comprising an on-DC voltage source for supplying an on voltage to the control electrode, an off-DC voltage source for supplying an off voltage to the control electrode, on/off switch means for switching the on-DC voltage source and the off-DC voltage source, switching signal generation means for supplying a signal to the on/off switch means, a gate resistor being connected between the on/off switch means and the control electrode, switch means being connected to the control electrode, a capacitor being connected between the switch means and one end of the main electrode, voltage adjustment means being connected to the switch means in parallel, and current decrease start point detection means for detecting a current decrease start point when a transition is made from a first period in which change in a current flowing into the main electrodes is moderate to a second period in which current change is abrupt when a voltage applied to the control electrode is lowered for making a transition from a conduction state to a non-conduction state between the main electrodes, characterized in that the switch means is operated so that the control electrode and the capacitor are connected in the second period in response to output of the current decrease start point detection means.

In the semiconductor device drive circuit according to a sixth aspect of the invention, the current decrease start point detection means comprises means for detecting a voltage of the control electrode of the insulated gate bipolar transistor, a reference voltage source, and means for comparing output of the voltage detection means with output of the reference voltage source.

In the semiconductor device drive circuit according to a seventh aspect of the invention, the current decrease start point detection means comprises means for detecting a current flowing into the control electrode of the insulated gate bipolar transistor, a reference voltage source, and means for comparing output of the current detection means with output of the reference voltage source.

In the semiconductor device drive circuit according to an eighth aspect of the invention, the current decrease start point detection means comprises means for detecting a voltage of the control electrode of the insulated gate bipolar transistor, means for differentiating output of the voltage detection means, a reference voltage source, and means for comparing output of the differentiation means with output of the reference voltage source.

In the semiconductor device drive circuit according to a ninth aspect of the invention, the current decrease start point detection means comprises means for detecting a current flowing through the control electrode of the insulated gate bipolar transistor, means for differentiating output of the current detection means, a reference voltage source, and means for comparing output of the differentiation means with output of the reference voltage source.

DETAILED DESCRIPTION OF THE PREFERRED EMBODIMENTS

First Embodiment

Figure 2:
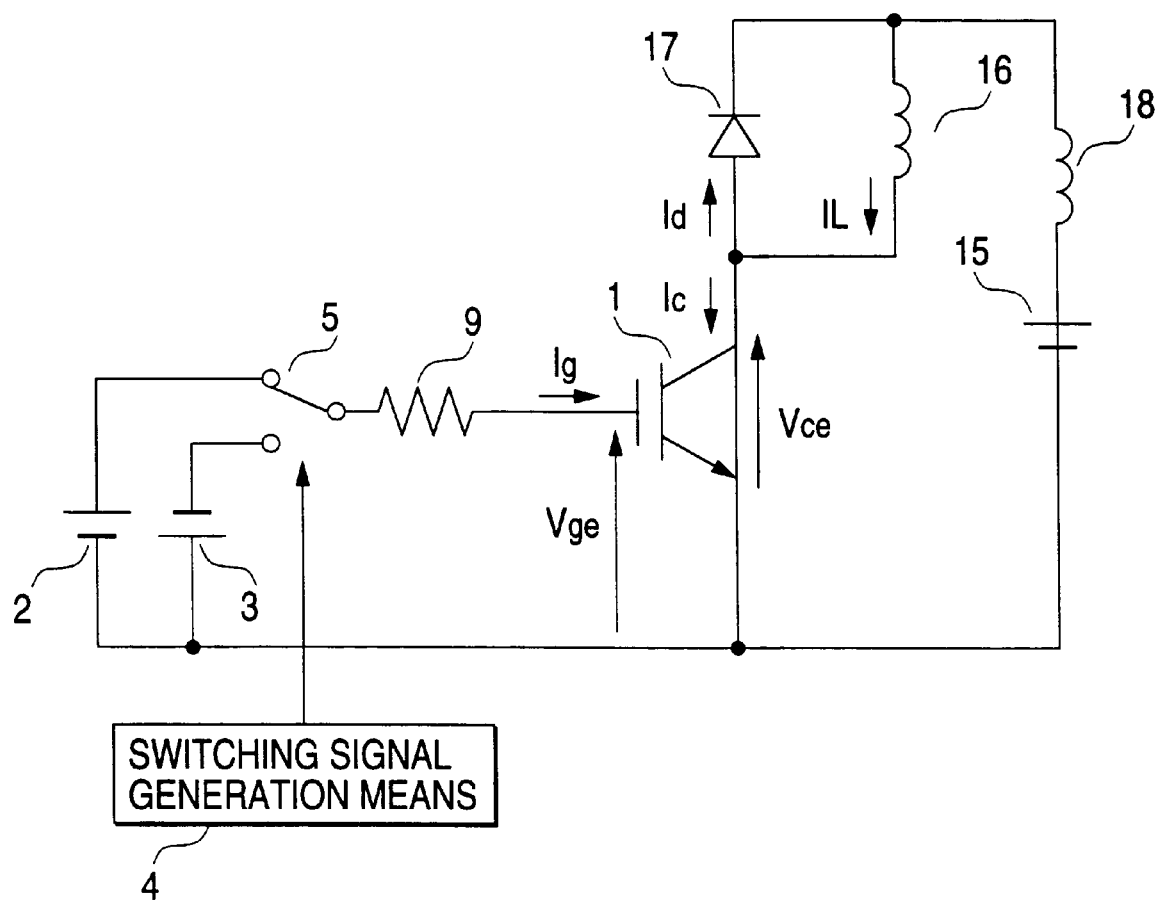
FIG. 2 is a circuit diagram to explain the operation of current decrease start point detection means in the invention.
Figure 3:
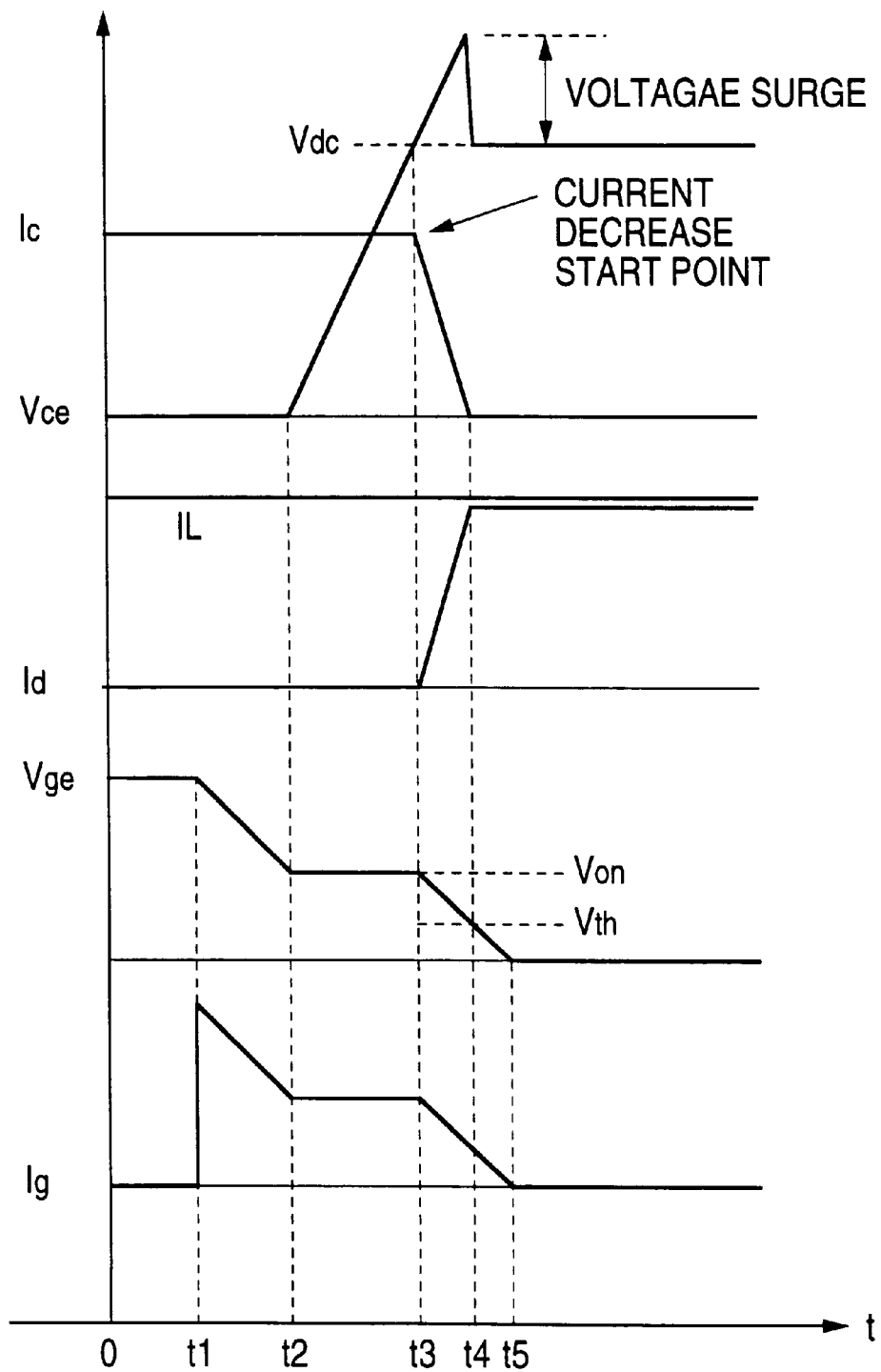
FIG. 3 is a waveform chart to explain the operation of the current decrease start point detection means in the invention.

A first embodiment of the invention will be discussed referring to the accompanying drawings. First, the current decrease start point when the transition is made from the first period in which change in a current flowing into an IGBT is moderate to the second period in which current change is abrupt when the on-to-off state transition of the IGBT is made will be discussed with reference to FIGS. 2 and 3. FIG. 2 shows an example of a switching circuit. FIG. 3 is a waveform chart of voltage and current of an IGBT 1 in the switching circuit in FIG. 2.

Figure 18:
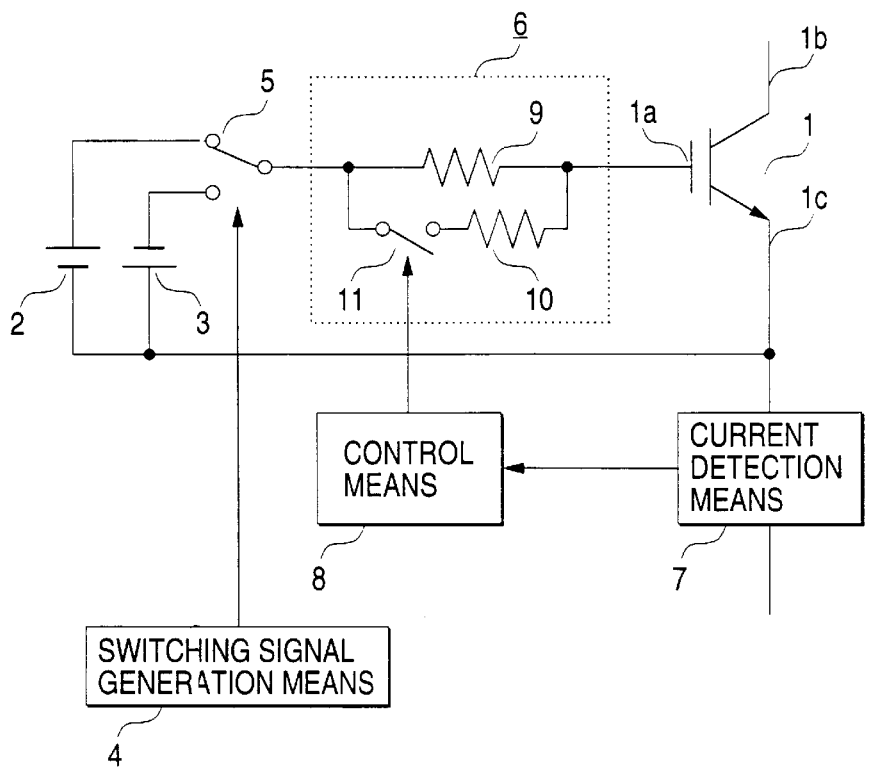
FIG. 18 is a block diagram to show a semiconductor device drive circuit in prior art.
Figure 19:
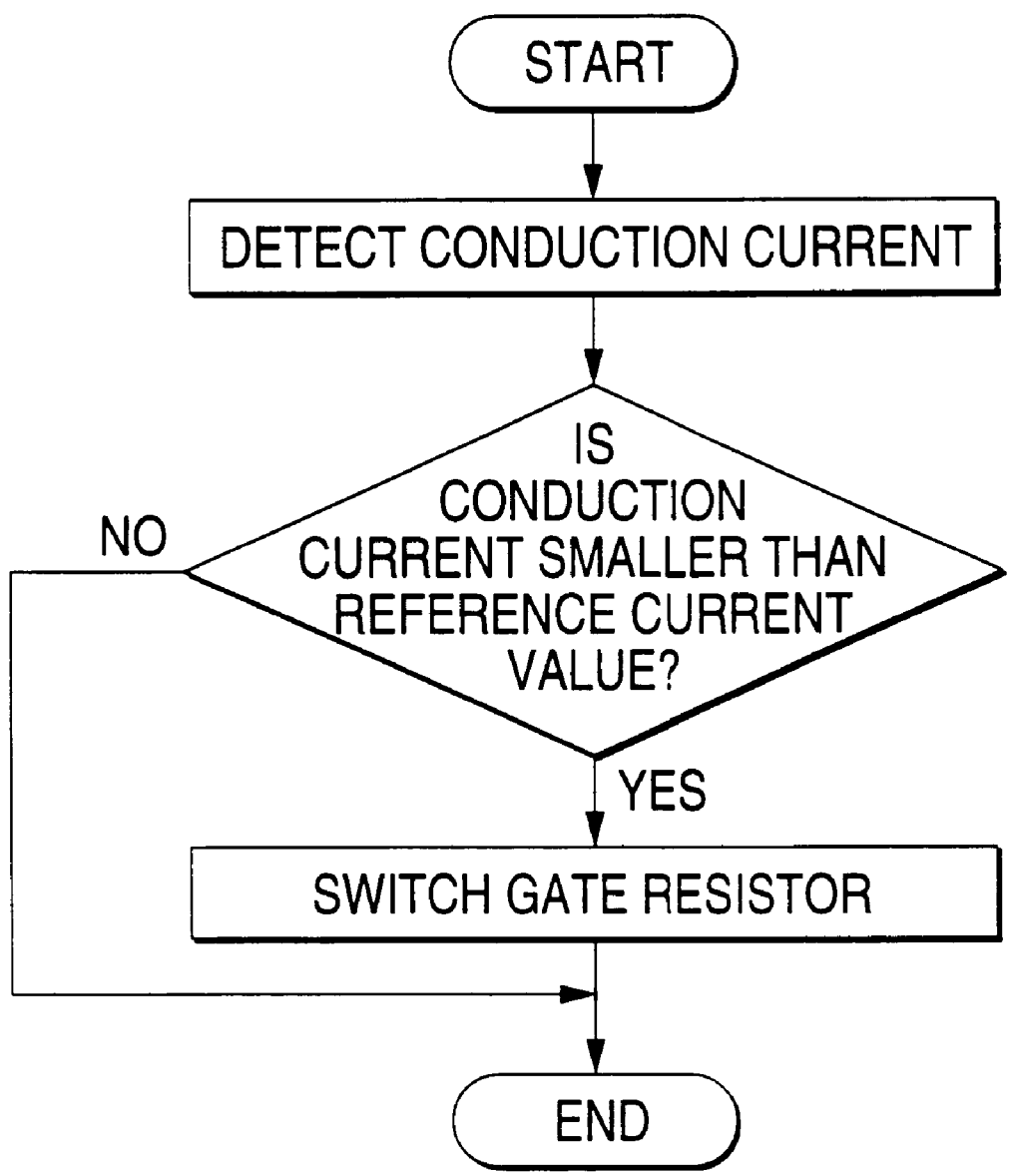
FIG. 19 is a flowchart to show the operation of control means of the semiconductor device drive circuit in the prior art.
Figure 20A:
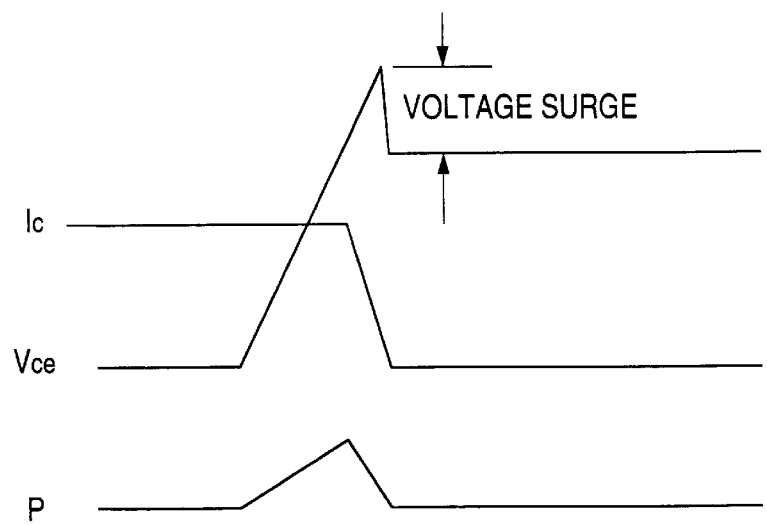
FIG. 20 is a waveform chart to show the operation of the semiconductor device drive circuit in the prior art.
Figure 20B:
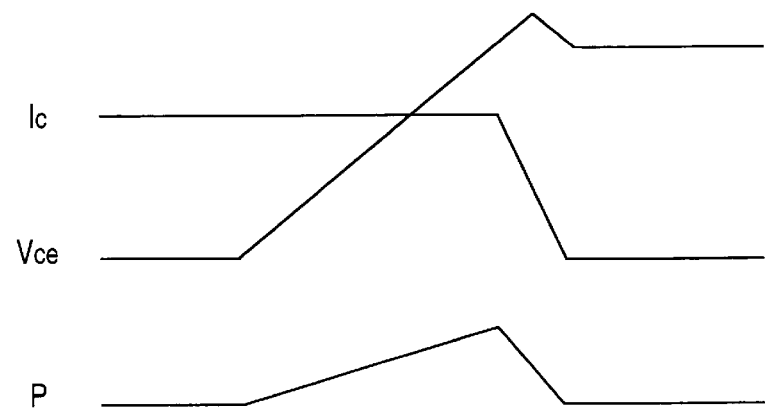
Figure 21:
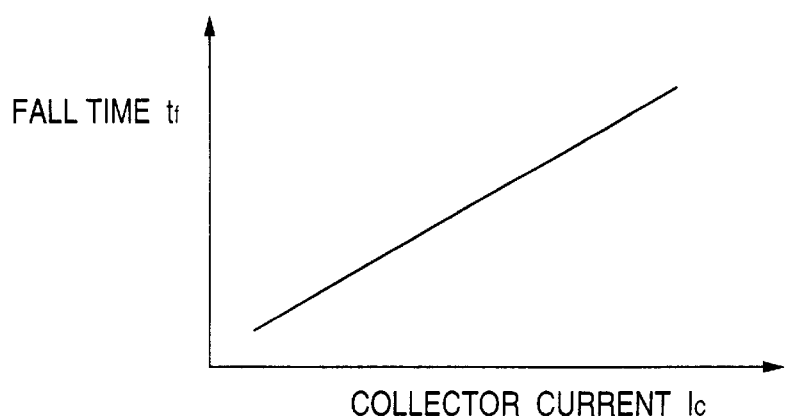
FIG. 21 is an illustration to show a switching characteristic of an IGBT.

In FIG. 2, numeral 9 is a gate resistor, numeral 15 is a DC voltage source, numeral 16 is a load, numeral 17 is a free wheeling diode, and numeral 18 is a wiring inductance. Numerals 1 to 5 are identical with those of the semiconductor device drive circuit in the prior art in FIG. 18 and therefore will not be discussed again.

When switching signal generation means 4 outputs an on signal, on/off switch means 5 switches to an on-DC voltage source 2 for applying an on voltage via the gate resistor 9 to a gate of the IGBT 1, turning on the IGBT 1. When the IGBT 1 is turned on, voltage Vdc of the DC voltage source 15 is applied to the load 16 and a current flows on a path of the DC voltage source 15 to the wiring inductance 18 to the load 16 to the IGBT 1 to the DC voltage source 15. The voltage and current of the IGBT 1 at the time are represented by the point of time 0 in FIG. 3. Since the IGBT 1 is turned on at time 0, collector-to-emitter voltage Vce is 0 and collector current Ic equals current IL of the load 16. Since a capacitor is between the gate and emitter of the IGBT 1, if the on time is sufficiently long, gate-to-emitter voltage Vge is charged to the voltage of the on-DC voltage source 2 and gate current Ig becomes 0.

Next, when the switching signal generation means 4 outputs an off signal at time t1, the on/off switch means 5 switches to an off-DC voltage source 3 for applying an off voltage via the gate resistor 9 to the gate of the IGBT 1, turning off the IGBT 1. In FIG. 3, since the off-DC voltage source 3 is set to 0, the gate-to-emitter voltage Vge starts to decrease toward 0 (zero) at a time constant (gate resistor 9×gate-to-emitter capacitor of IGBT 1). However, normally the on-DC voltage source 2 is set sufficiently high relative to the on voltage required for causing the load current IL to flow, thus the actual turn-off operation of the IGBT 1 is not performed until the gate-to-emitter voltage Vge reaches the minimum voltage Von required for causing the load current IL to flow at time t2. When the gate-to-emitter voltage Vge reaches the voltage Von required for causing the load current IL to flow at time t2, the IGBT 1 starts the turn-off operation and the collector-to-emitter voltage Vce is increased. At this time, the voltage applied to the load 16 becomes the voltage Vdc of the DC voltage source 15 less the collector-to-emitter voltage Vce. However, because of inductance load, the current IL flowing through the load 16 does not suddenly change. Thus, the collector current Ic does not suddenly change either and forms the first period in which current change is moderate. In the first period, the feedback action works attempting to maintain the gate-to-emitter voltage Vge at the voltage Von required for causing the load current IL to flow so that the collector current IC is not changed, and the gate-to-emitter voltage Vge becomes almost constant voltage. As the collector-to-emitter voltage Vce is increased, a displacement current flows from the collector into the gate via the collector-to-gate capacitor of the IGBT 1 and causes a voltage drop to occur at the gate resistor 9, whereby the feedback action is accomplished. Since the displacement current is none other than gate current, the gate current Ig also becomes almost constant current.

When the collector-to-emitter voltage Vce reaches the voltage Vdc of the DC voltage source 15 at time t3, the free wheeling diode 17 is turned on and the current flowing through the load 16 starts commutation to the free wheeling diode 17. The collector current Ic is decreased as much as current Id commutated to the free wheeling diode 17, thus forms the second period in which current change is abrupt. In the second period, the feedback action attempting to hold the gate-to-emitter voltage Vge constant is lost and the gate-to-emitter voltage Vge again starts to decrease toward 0. Therefore, the gate current Ig determined by the gate-to-emitter voltage Vge and the gate resistor 9 is also decreased. Since the collector current Ic equals the current flowing into the wiring inductance 18, the current flowing into the wiring inductance 18 is also decreased in the second period. Thus, the wiring inductance 18 generates a voltage represented by (wiring inductance×current decrease rate). Since this voltage has the same polarity as the DC voltage source 15, the collector-to-emitter voltage Vce becomes a waveform of superimposing a voltage surge generated by the wiring inductance 18 on the DC voltage source 15.

When the gate-to-emitter voltage Vge reaches threshold value Vth of the IGBT 1 at time t4, the collector current Ic becomes 0 and the IGBT 1 completes the turn-off operation. Although the actual turn-off operation is complete on and after time t4, the gate-to-emitter voltage Vge does not reach 0, thus continues to decrease toward 0.

The gate-to-emitter voltage Vge reaches 0 at time t5 and the operation is completed. In the turn-off operation of the IGBT 1, in the invention, the current decrease start point is defined as the boundary between the first period in which change of the collector current Ic is moderate (t2 to t3) and the second period in which change of the collector current Ic is abrupt (t3 to t4), namely, the point of time t3. If another definition is made, the current decrease start point almost equals the time at which the secondary differential coefficient of the collector current Ic becomes the maximum.

Figure 1:
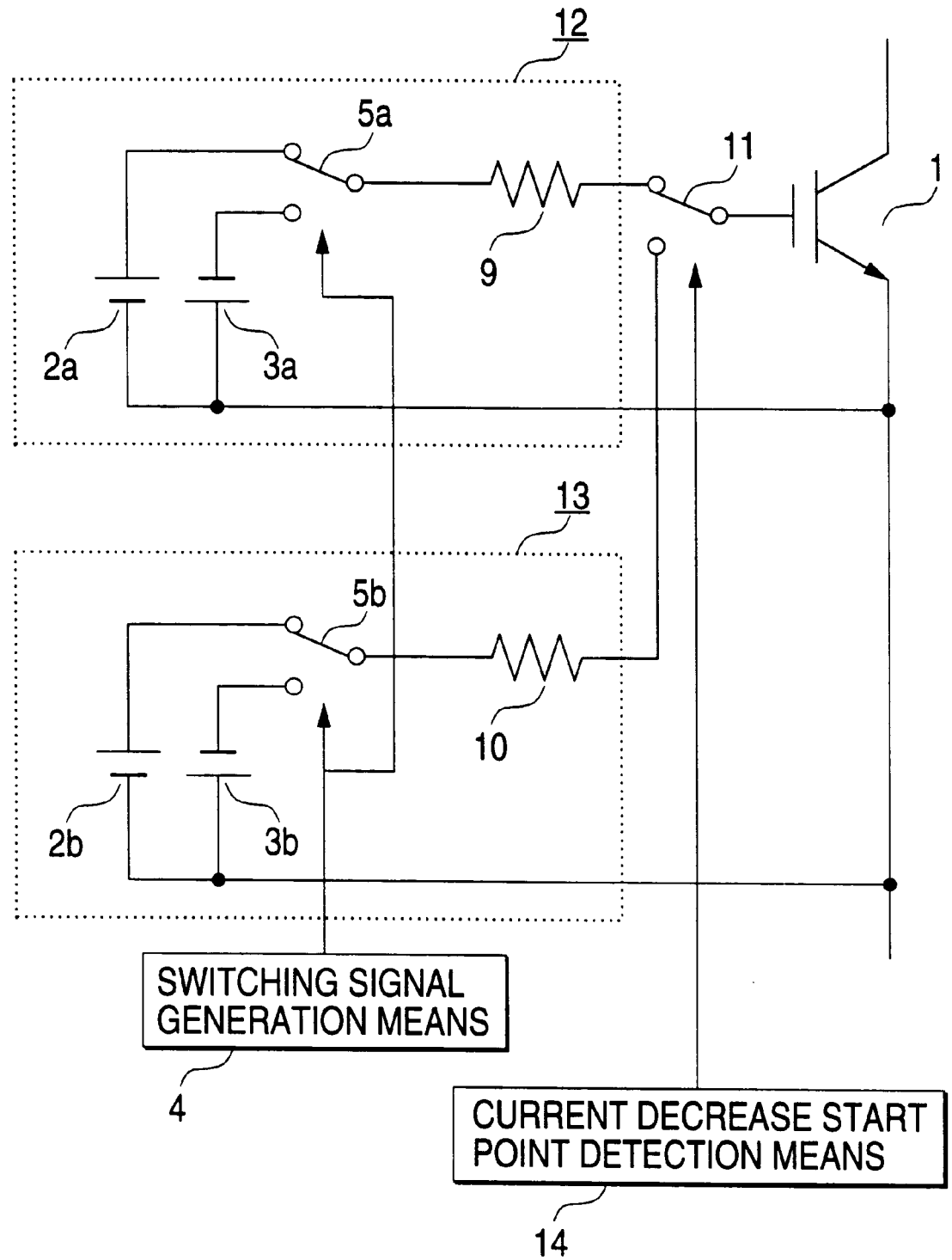
FIG. 1 is a circuit diagram to show a semiconductor device drive circuit according to a first embodiment of the invention.

Next, the configuration of the first embodiment of the invention will be discussed with reference to FIG. 1. Here, numeral 12 is first drive means and numeral 13 is second drive means. The second drive means 13 drives the IGBT 1 at lower speed than the first drive means 12. Numeral 11 is switch means for switching output of the first drive means 12 and output of the second drive means 13 and supplying the output to the gate of the IGBT 1 and numeral 14 is current decrease start point detection means for detecting a current decrease start point when the transition is made from the first period in which change in the current flowing into the IGBT 1 is moderate to the second period in which current change is abrupt when the on-to-off state transition of the IGBT 1 is made. Numerals 1 to 4 are identical with those of the semiconductor device drive circuit in the prior art in FIG. 18 and therefore will not be discussed again. Numerals 2a and 2b are first and second on-DC voltage sources for supplying a voltage for turning on the IGBT 1, numerals 3a and 3b are first and second off-DC voltage sources for supplying a voltage for turning off the IGBT 1, numerals 5a and 5b are first and second on/off switch means for switching the first and second on-DC voltage sources 2a and 2b and the first and second off-DC voltage sources 3a and 3b in response to output of the switching signal generation means 4 for applying a voltage to the gate of the IGBT 1, numeral 9 is a first gate resistor, and numeral 10 is a second gate resistor. The second gate resistor 10 has a larger resistance value than the first gate resistor 9.

Figure 4A:
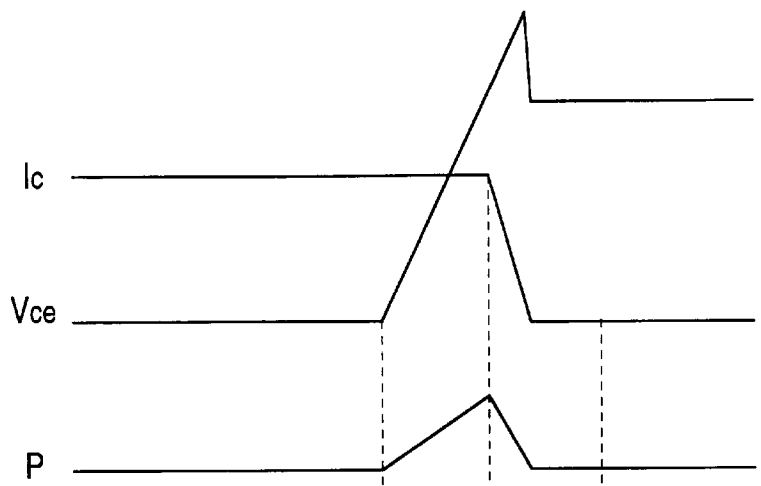
FIGS. 4A to 4C are waveform charts to explain the operation of the semiconductor device drive circuit according to the first embodiment of the invention.
Figure 4B:
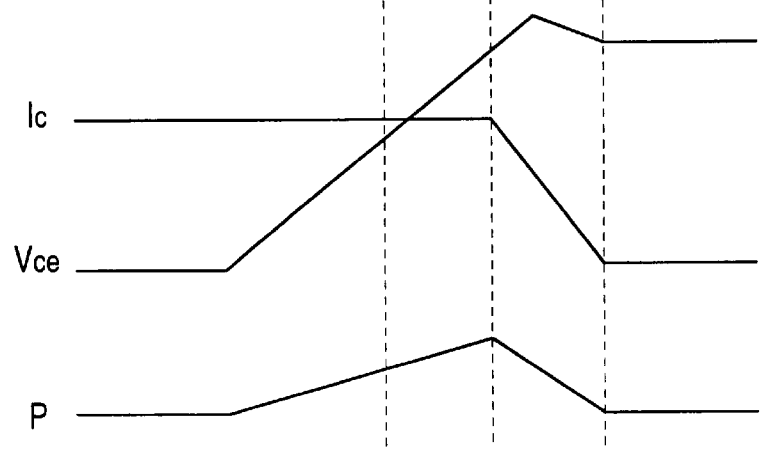
Figure 4C:
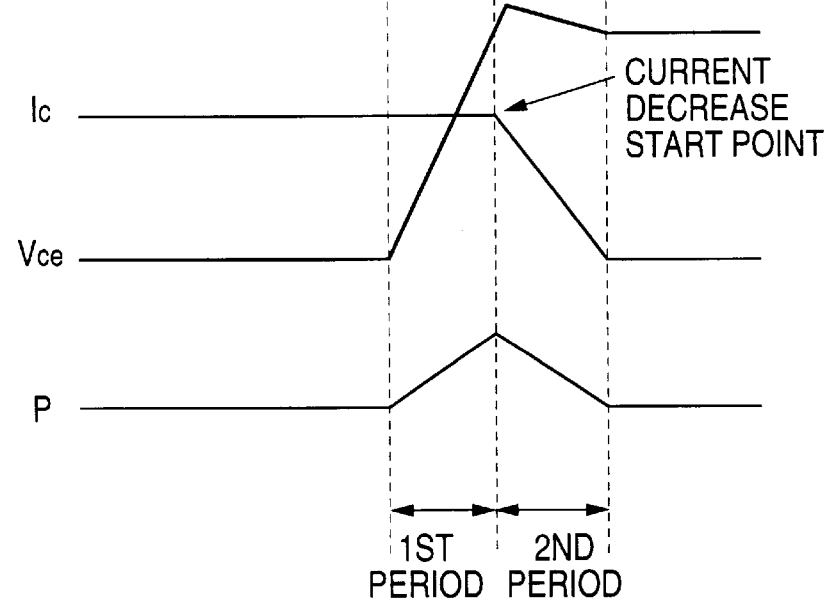

Next, the operation will be discussed with reference to FIGS. 1 and 4A to 4C. FIGS. 4A to 4C show the collector current Ic of conduction current of the IGBT 1, the collector-to-emitter voltage Vce of the IGBT 1, and switching loss P of the IGBT 1. FIG. 4A shows a case where the gate resistance value is small, namely, the IGBT 1 is driven by the first drive means 12, FIG. 4B shows a case where the gate resistance value is large, namely, the IGBT 1 is driven by the second drive means 13, and FIG. 4C shows a case where the invention is applied. When the switching signal generation means 4 outputs an on signal, the first and second on/off switch means 5a and 5b switch to the first and second on-DC voltage sources 2a and 2b for applying an on voltage via the first gate resistor 9 or the second gate resistor 10 to the gate of the IGBT 1, turning on the IGBT 1. Next, when the switching signal generation means 4 outputs an off signal, the first and second on/off switch means 5a and 5b switch to the first and second off-DC voltage sources 3a and 3b for applying an off voltage via the first gate resistor 9 or the second gate resistor 10 to the gate of the IGBT 1, turning off the IGBT 1. At this time, in the first period in which change of the collector current Ic is moderate, the switch means 11 switches to the first drive means 12 in response to output of the current decrease start point detection means 14 and the IGBT 1 is driven in the state in which the gate resistance value is small shown in FIG. 4A. In the second period in which change of the collector current Ic is abrupt, the switch means 11 switches to the second drive means 13 in response to output of the current decrease start point detection means 14 and the IGBT 1 is driven in the state in which the gate resistance value is large shown in FIG. 4B. As a result, as shown in FIG. 4C, a voltage and current waveform equivalent to that in FIG. 4A is obtained before the current decrease start point and a voltage and current waveform equivalent to that in FIG. 4B is obtained after the current decrease start point. Therefore, the semiconductor device drive circuit of the invention can drive the IGBT 1 at high speed for decreasing the switching loss P in the first period not involved in the voltage surge and drive the IGBT 1 at low speed for suppressing the voltage surge in the second period involved in the voltage surge.

Second Embodiment

Figure 5A:
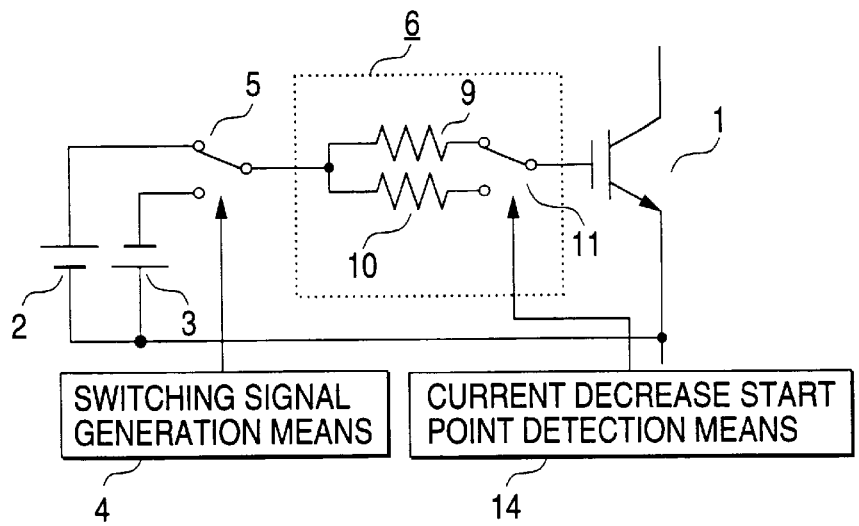
FIGS. 5A to 5C are circuit diagrams to show semiconductor device drive circuits according to a second embodiment of the invention.
Figure 5B:
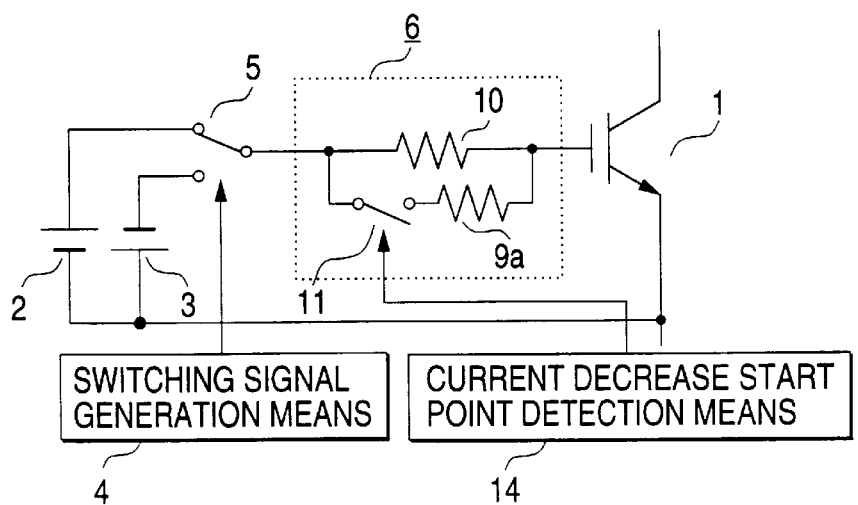
Figure 5C:
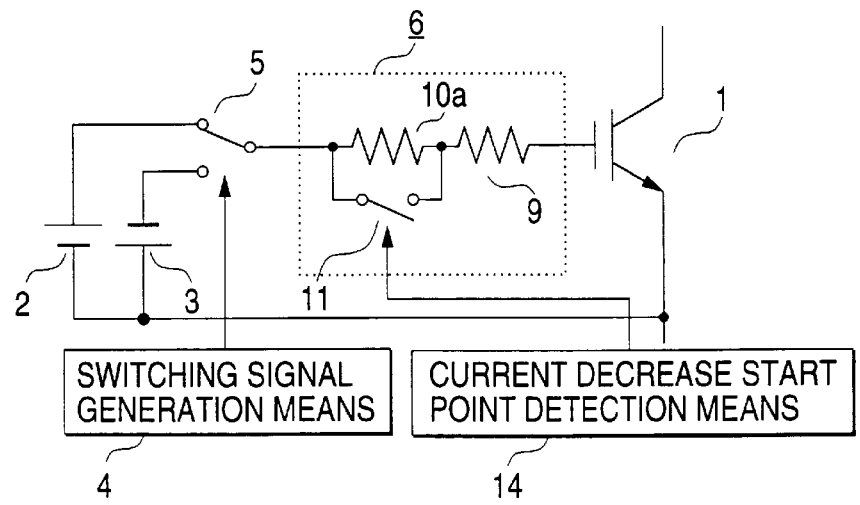

FIGS. 5A to 5C show the circuit configurations of a second embodiment of the invention. In the figure, numeral 6 is gate resistor switch means, numeral 9 is a first gate resistor, and numeral 10 is a second gate resistor. The second gate resistor 10 has a larger resistance value than the first gate resistor 9. Numeral 9a is a resistor connected in parallel for providing a resistance value equivalent to the first resistor 9 and numeral 10a is a resistor connected in series for providing a resistance value equivalent to the second resistor 10. Other circuit parts are identical with those of the semiconductor device drive circuit in the prior art in FIG. 18 or those of the first embodiment in FIG. 1 and therefore will not be discussed again.

Next, the operation will be discussed with reference to FIG. 5A. When switching signal generation means 4 outputs an on signal, on/off switch means 5 switches to an on-DC voltage source 2 for applying an on voltage via the first gate resistor 9 or the second gate resistor 10 to a gate of an IGBT 1, turning on the IGBT 1. Next, when the switching signal generation means 4 outputs an off signal, the on/off switch means 5 switches to the off-DC voltage source 3 for applying an off voltage via the first gate resistor 9 or the second gate resistor 10 to the gate of the IGBT 1, turning off the IGBT 1. At this time, in the first period in which change of collector current Ic is moderate, switch means 11 of the gate resistor switch means 6 switches to the first gate resistor 9 in response to output of current decrease start point detection means 14 and the IGBT 1 is driven in the state in which the gate resistance value is small. In the second period in which change of the collector current Ic is abrupt, the switch means 11 switches to the second gate resistor 10 in response to output of the current decrease start point detection means 14 and the IGBT 1 is driven in the state in which the gate resistance value is large. As a result, the semiconductor device drive circuit of the second embodiment can drive the IGBT 1 at high speed for decreasing switching loss P in the first period not involved in the voltage surge and drive the IGBT 1 at low speed for suppressing the voltage surge in the second period involved in the voltage surge.

Next, the operation will be discussed with reference to FIG. 5B. The operation other than the gate resistor switch means 6 is the same as that in FIG. 5A and will not be discussed again. When the IGBT 1 is turned off, in the first period in which change of the collector current Ic is moderate, the switch means 11 is short-circuited in response to output of the current decrease start point detection means 14 and resultant resistance of the resistor 9a and the second gate resistor 10 is used as gate resistance. Since the resistor 9a and the second gate resistor 10 are connected in parallel, the resultant resistance becomes smaller than the resistance value of the second gate resistor 10. At this time, the resistor 9a is selected so that the resultant resistance of the resistor 9a and the second gate resistor 10 becomes a resistance value equal to the first gate resistor 9 in FIG. 5A. According to the operation, in the first period, the IGBT 1 is driven in the state in which the gate resistance value is small. In the second period in which change of the collector current Ic is abrupt, the switch means 11 is opened in response to output of the current decrease start point detection means 14 and only the second gate resistor 10 is used as the gate resistor. According to the operation, in the second period, the IGBT 1 is driven in the state in which the gate resistance value is large. As a result, the semiconductor device drive circuit of the second embodiment can drive the IGBT 1 at high speed for decreasing the switching loss P in the first period not involved in the voltage surge and drive the IGBT 1 at low speed for suppressing the voltage surge in the second period involved in the voltage surge.

Next, the operation will be discussed with reference to FIG. 5C. The operation other than the gate resistor switch means 6 is the same as that in FIG. 5A and will not be discussed again. When the IGBT 1 is turned off, in the first period in which change of the collector current Ic is moderate, the switch means 11 is short-circuited in response to output of the current decrease start point detection means 14 and the first gate resistor 9 is used as the gate resistor. According to the operation, in the first period, the IGBT 1 is driven in the state in which the gate resistance value is small. In the second period in which change of the collector current Ic is abrupt, the switch means 11 is opened in response to output of the current decrease start point detection means 14 and resultant resistance of the resistor 9 and the second gate resistor 10a is used as gate resistance. Since the first gate resistor 9 and the resistor 10a are connected in series, the resultant resistance becomes larger than the resistance value of the first gate resistor 9. At this time, the resistor 10a is selected so that the resultant resistance of the first gate resistor 9 and the resistor 10a becomes a resistance value equal to the second gate resistor 10 in FIG. 5A. According to the operation, in the second period, the IGBT 1 is driven in the state in which the gate resistance value is large. As a result, the semiconductor device drive circuit of the second embodiment can drive the IGBT 1 at high speed for decreasing the switching loss P in the first period not involved in the voltage surge and drive the IGBT 1 at low speed for suppressing the voltage surge in the second period involved in the voltage surge.

Third Embodiment

Figure 6A:
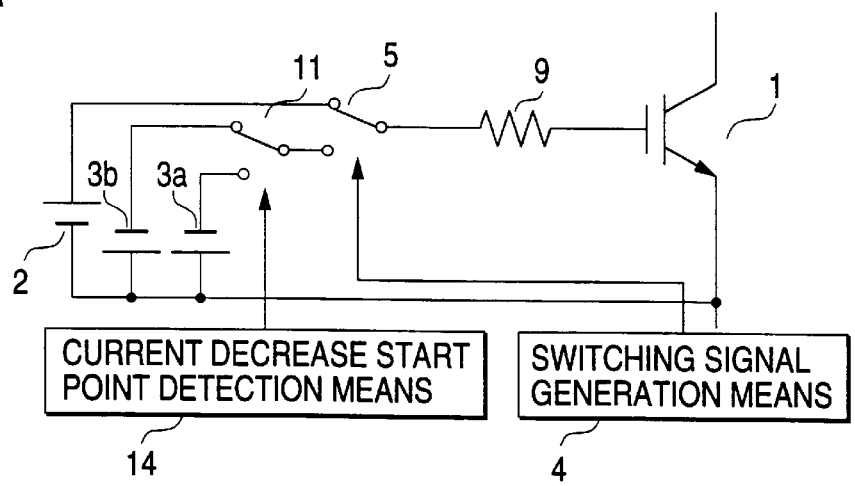
FIGS. 6A to 6C are circuit diagrams to show semiconductor device drive circuits according to a third embodiment of the invention.
Figure 6B:
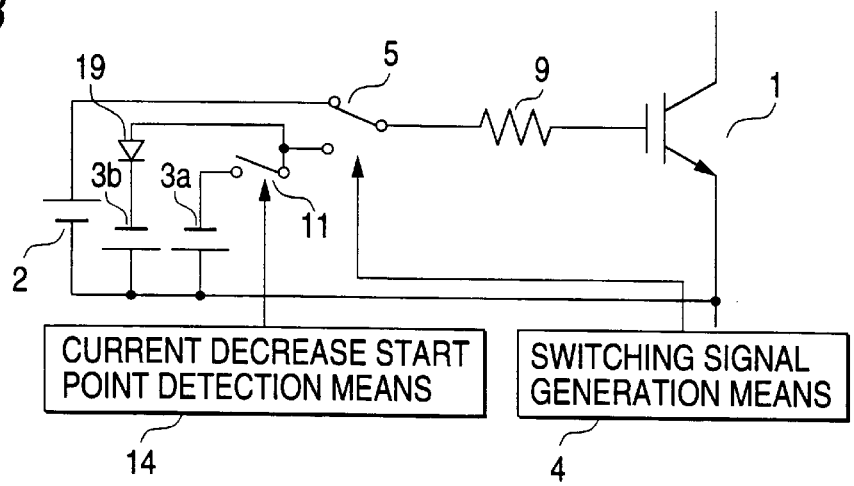
Figure 6C:
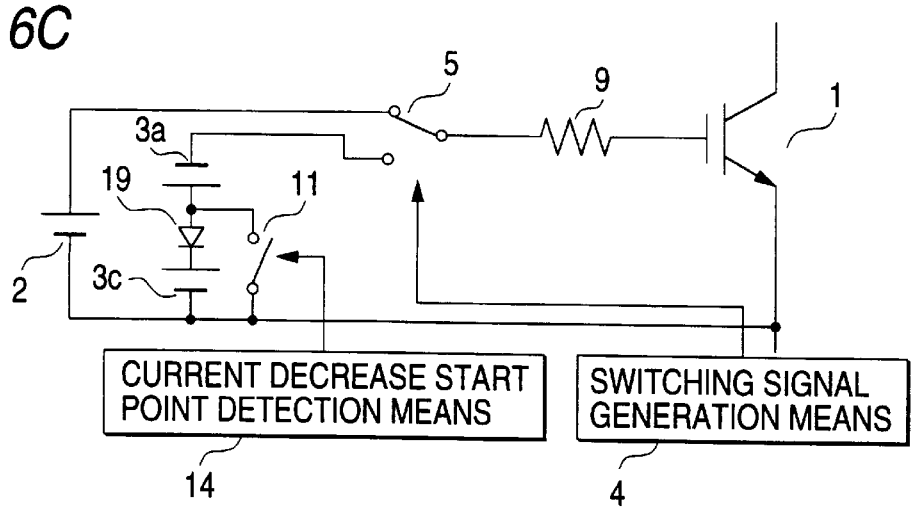

FIGS. 6A to 6C show the circuit configurations of a third embodiment of the invention. In the figure, numeral 3a is a first off-DC voltage source and numeral 3b is a second off-DC voltage source. Voltage values are set so that the second off-DC voltage source 3b can apply a smaller negative voltage to a gate of an IGBT 1 than the first off-DC voltage source 3a. Numeral 3c is a DC voltage source connected in series for providing a voltage value equivalent to the second off-DC voltage source 3b, numeral 9 is a resistor, and numeral 19 is a diode. Other circuit parts are identical with those of the semiconductor device drive circuit in the prior art in FIG. 18 or those of the first embodiment in FIG. 1 and therefore will not be discussed again.

Next, the operation will be discussed with reference to FIG. 6A. When switching signal generation means 4 outputs an on signal, on/off switch means 5 switches to an on-DC voltage source 2 for applying an on voltage via a gate resistor 9 to the gate of the IGBT 1, turning on the IGBT 1. Next, when the switching signal generation means 4 outputs an off signal, the on/off switch means 5 switches to the first off-DC voltage source 3a or the second off-DC voltage source 3b for applying an off voltage via the gate resistor 9 to the gate of the IGBT 1, turning off the IGBT 1. At this time, in the first period in which change of collector current Ic is moderate, switch means 11 switches to the first off-DC voltage source 3a in response to output of current decrease start point detection means 14 and the IGBT 1 is driven in the state in which the off voltage is large. In the second period in which change of the collector current Ic is abrupt, the switch means 11 switches to the second off-DC voltage source 3b in response to output of the current decrease start point detection means 14 and the IGBT 1 is driven in the state in which the off voltage is small. Since a capacitor is between the gate and emitter of the IGBT 1, if the IGBT 1 is driven with the same gate resistor, the decrease rate of the gate-to-emitter voltage is lessened as the off voltage is smaller, producing a similar effect of increasing the gate resistance value. As a result, the semiconductor device drive circuit of the third embodiment can drive the IGBT 1 at high speed for decreasing switching loss P in the first period not involved in the voltage surge and drive the IGBT 1 at low speed for suppressing the voltage surge in the second period involved in the voltage surge.

Next, the operation will be discussed with reference to FIG. 6B. The operation other than the switching of the first and second off-DC voltage sources 3a and 3b is the same as that in FIG. 6A and will not be discussed again. When the IGBT 1 is turned off, in the first period in which change of the collector current Ic is moderate, the switch means 11 is short-circuited in response to output of the current decrease start point detection means 14. Since voltage values are set so that the first off-DC voltage source 3a can apply a larger negative voltage to the gate of the IGBT 1 than the second off-DC voltage source 3b, a reverse voltage is applied to the diode 19, which then is turned off. Thus, only the first off-DC voltage source 3a is applied to the gate of the IGBT 1 via the gate resistor 9. According to the operation, in the first period, the IGBT 1 is driven in the state in which the off voltage is large. In the second period in which change of the collector current Ic is abrupt, the switch means 11 is opened in response to output of the current decrease start point detection means 14 for using only the second off-DC voltage source 3b. According to the operation, in the second period, the IGBT 1 is driven in the state in which the off voltage is small. As a result, the semiconductor device drive circuit of the third embodiment can drive the IGBT 1 at high speed for decreasing the switching loss P in the first period not involved in the voltage surge and drive the IGBT 1 at low speed for suppressing the voltage surge in the second period involved in the voltage surge.

Next, the operation will be discussed with reference to FIG. 6C. The operation other than the switching of the first and second off-DC voltage sources 3a and 3b is the same as that in FIG. 6A and will not be discussed again. When the IGBT 1 is turned off, in the first period in which change of the collector current Ic is moderate, the switch means 11 is short-circuited in response to output of the current decrease start point detection means 14 for applying only the first off-DC voltage source 3a to the gate of the IGBT 1 via the gate resistor 9. At this time, the voltage of the DC voltage source 3c is applied as a reverse voltage to the diode 19, which then is turned off. Thus, unnecessary current does not flow into the switch means 11. According to the operation, in the first period, the IGBT 1 is driven in the state in which the off voltage is low. In the second period in which change of the collector current Ic is abrupt, the switch means 11 is opened in response to output of the current decrease start point detection means 14 for applying the sum voltage of the first off-DC voltage source 3a and the DC voltage source 3c to the gate of the IGBT 1 via the gate resistor 9. Since the first off-DC voltage source 3a and the DC voltage source 3c are connected in reverse series, the sum voltage becomes a negative voltage smaller than the first off-DC voltage source 3a. At this time, the DC voltage source 3c is selected so that the sum voltage of the first off-DC voltage source 3a and the DC voltage source 3c becomes a voltage value equal to the second off-DC voltage source 3b in FIG. 6A. According to the operation, in the second period, the IGBT 1 is driven in the state in which the off voltage is small. As a result, the semiconductor device drive circuit of the third embodiment can drive the IGBT 1 at high speed for decreasing the switching loss P in the first period not involved in the voltage surge and drive the IGBT 1 at low speed for suppressing the voltage surge in the second period involved in the voltage surge.

Fourth Embodiment

Figure 7A:
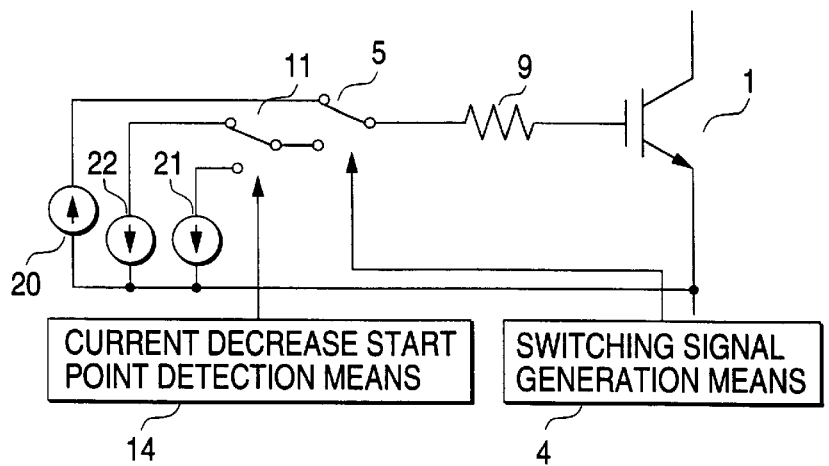
FIGS. 7A to 7C are circuit diagrams to show semiconductor device drive circuits according to a fourth embodiment of the invention.
Figure 7B:
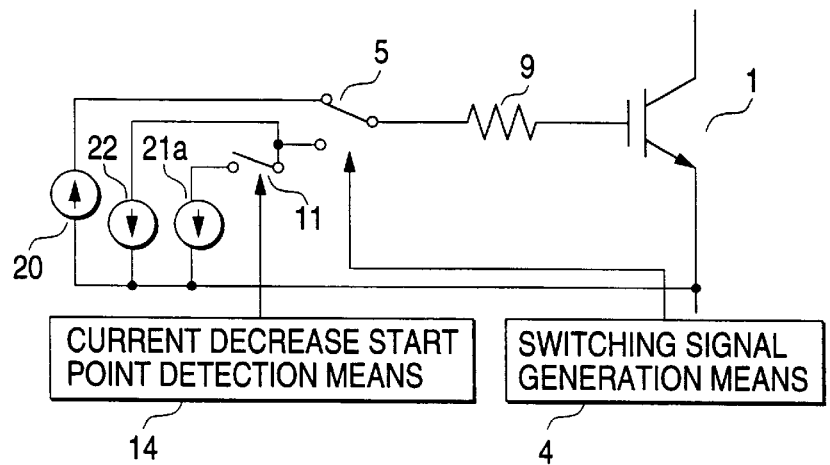
Figure 7C:
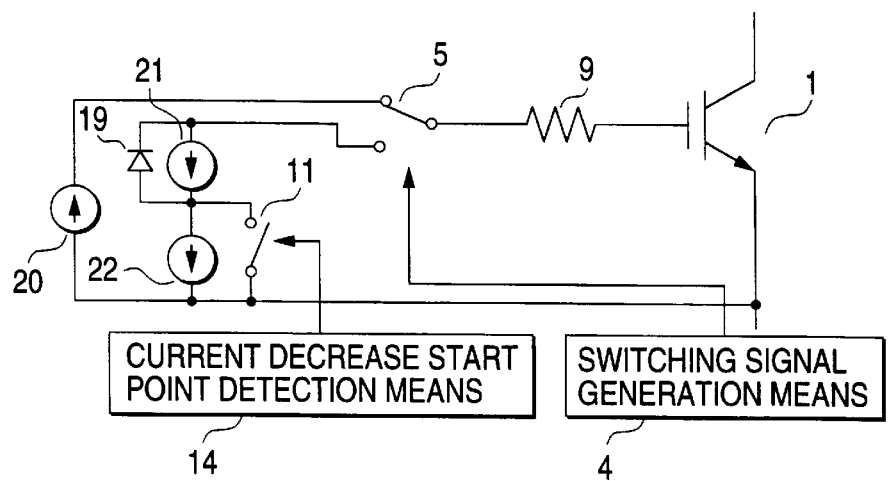

FIGS. 7A to 7C show the circuit configurations of a fourth embodiment of the invention. In the figure, numeral 19 is a diode, numeral 20 is an on-DC current source, numeral 21 is a first off-DC current source, and numeral 22 is a second off-DC current source. The second off-DC current source 22 has a smaller current value than the first off-DC current source 21. Numeral 21a is a DC current source connected in parallel for providing a current value equivalent to the first off-DC current source 21. Other circuit parts are identical with those of the semiconductor device drive circuit in the prior art in FIG. 18 or those of the first embodiment in FIG. 1 and therefore will not be discussed again.

Next, the operation will be discussed with reference to FIG. 7A. When switching signal generation means 4 outputs an on signal, on/off switch means 5 switches to the on-DC current source 20 for applying a current to a gate of an IGBT 1. Since a capacitor is between the gate and emitter of the IGBT 1, gate-to-emitter voltage Vge is increased, turning on the IGBT 1. Next, when the switching signal generation means 4 outputs an off signal, the on/off switch means 5 switches to the first off-DC current source 21 or the second off-DC current source 22 for drawing out a current from the gate of the IGBT 1, turning off the IGBT 1. Since the capacitor is between the gate and emitter of the IGBT 1, the gate-to-emitter voltage Vge is decreased, turning off the IGBT 1. At this time, in the first period in which change of collector current Ic is moderate, switch means 11 switches to the first off-DC current source 21 in response to output of current decrease start point detection means 14 and the IGBT 1 is driven in the state in which the drawn-out current is large. In the second period in which change of the collector current Ic is abrupt, the switch means 11 switches to the second off-DC current source 22 in response to output of the current decrease start point detection means 14 and the IGBT 1 is driven in the state in which the drawn-out current is small. Since the capacitor is between the gate and emitter of the IGBT 1, the decrease rate of the gate-to-emitter voltage is lessened as the drawn-out current is smaller, producing a similar effect of increasing the gate resistance value. As a result, the semiconductor device drive circuit of the fourth embodiment can drive the IGBT 1 at high speed for decreasing switching loss P in the first period not involved in the voltage surge and drive the IGBT 1 at low speed for suppressing the voltage surge in the second period involved in the voltage surge.

Next, the operation will be discussed with reference to FIG. 7B. The operation other than the switching of the first and second off-DC current sources 21 and 22 is the same as that in FIG. 7A and will not be discussed again. When the IGBT 1 is turned off, in the first period in which change of the collector current Ic is moderate, the switch means 11 is short-circuited in response to output of the current decrease start point detection means 14 for drawing out the sum current of the DC currents source 21a and the second off-DC current source 22 from the gate of the IGBT 1. Since the DC current source 21a and the second off-DC current source 22 are connected in parallel, the sum current becomes larger than the second off-DC current source 22. At this time, the DC current source 21a is selected so that the sum current of the DC current source 21a and the second off-DC current source 22 becomes a current value equal to the first DC current source 21 in FIG. 7A. According to the operation, in the first period, the IGBT 1 is driven in the state in which the drawn-out current is large. In the second period in which change of the collector current Ic is abrupt, the switch means 11 is opened in response to output of the current decrease start point detection means 14 for using only the second off-DC current source 22. According to the operation, in the second period, the IGBT 1 is driven in the state in which the drawn-out current is small. As a result, the semiconductor device drive circuit of the fourth embodiment can drive the IGBT 1 at high speed for decreasing the switching loss P in the first period not involved in the voltage surge and drive the IGBT 1 at low speed for suppressing the voltage surge in the second period involved in the voltage surge.

Next, the operation will be discussed with reference to FIG. 7C. The operation other than the switching of the first and second off-DC current sources 21 and 22 is the same as that in FIG. 7A and will not be discussed again. When the IGBT 1 is turned off, in the first period in which change of the collector current Ic is moderate, the switch means 11 is short-circuited in response to output of the current decrease start point detection means 14 for drawing out a current from the gate of the IGBT 1 only with the first off-DC current source 21. At this time, the gate-to-emitter voltage Vge of the IGBT 1 is applied as a reverse voltage to the diode 19, which then is turned off. Thus, the current of the first off-DC current source 21 does not flow into the diode 19. According to the operation, in the first period, the IGBT 1 is driven in the state in which the drawn-out current is large. In the second period in which change of the collector current Ic is abrupt, the switch means 11 is opened in response to output of the current decrease start point detection means 14. Since the current of the second off-DC current source 22 is smaller than that of the first off-DC current source 21, the difference current flows through the diode 19 and the current of the second off-DC source current 22 is drawn out from the gate of the IGBT 1. According to the operation, in the second period, the IGBT 1 is driven in the state in which the drawn-out current is small. As a result, the semiconductor device drive circuit of the fourth embodiment can drive the IGBT 1 at high speed for decreasing the switching loss P in the first period not involved in the voltage surge and drive the IGBT 1 at low speed for suppressing the voltage surge in the second period involved in the voltage surge.

Fifth Embodiment

Figure 8A:
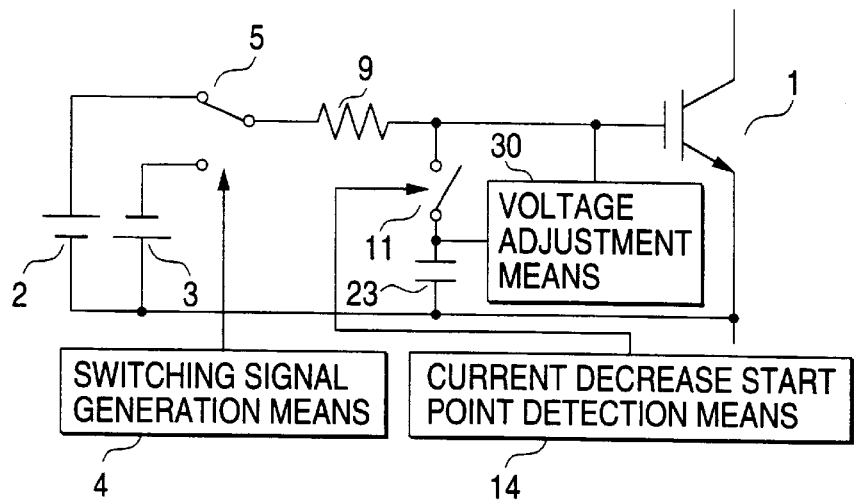
FIGS. 8A to 8C are circuit diagrams to show semiconductor device drive circuits according to a fifth embodiment of the invention.
Figure 8B:
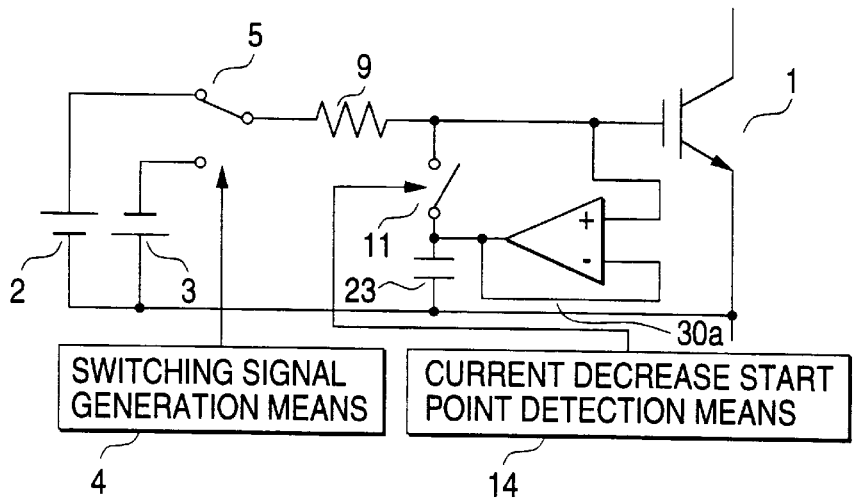
Figure 8C:
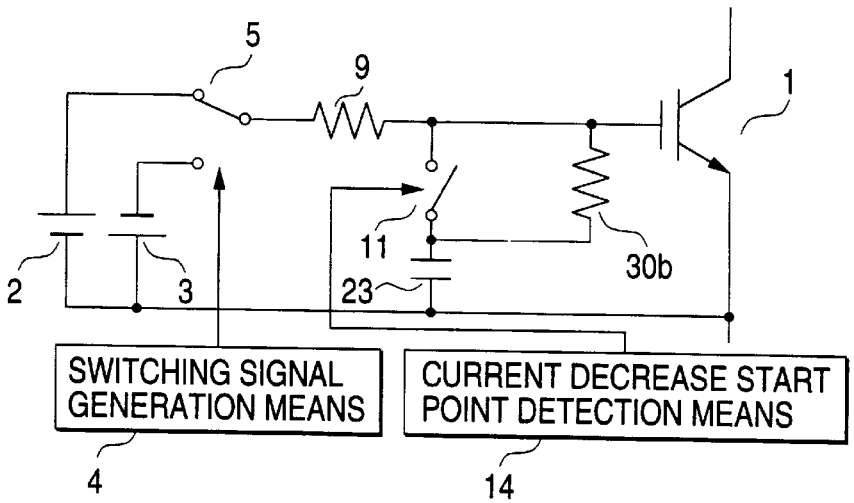

FIGS. 8A to 8C show the circuit configurations of a fifth embodiment of the invention. In the figure, numeral 9 is a gate resistor, numeral 23 is a capacitor, and numeral 30 is voltage adjustment means for holding the voltage of the capacitor 23 equal to gate-to-emitter voltage Vge of an IGBT 1. Other circuit parts are identical with those of the semiconductor device drive circuit in the prior art in FIG. 18 or those of the first embodiment in FIG. 1 and therefore will not be discussed again.

Next, the operation will be discussed with reference to FIG. 8A. When switching signal generation means 4 outputs an on signal, on/off switch means 5 switches to an on-DC voltage source 2 for applying an on voltage via the gate resistor 9 to the gate of the IGBT 1, turning on the IGBT 1. Next, when the switching signal generation means 4 outputs an off signal, the on/off switch means 5 switches to an off-DC voltage source 3 for applying an off voltage via the gate resistor 9 to the gate of the IGBT 1, turning off the IGBT 1. At this time, in the first period in which change of collector current Ic is moderate, switch means 11 is opened in response to output of current decrease start point detection means 14 and the IGBT 1 is driven in the state in which only gate-to-emitter capacitor of the IGBT 1 exists between the gate and emitter of the IGBT 1. In the second period in which change of the collector current Ic is abrupt, the switch means 11 is short-circuited in response to output of the current decrease start point detection means 14 and the capacitor 23 is connected in parallel between the gate and emitter of the IGBT 1. At this time, since the voltage of the capacitor 23 is held equal to the gate-to-emitter voltage Vge of the IGBT 1 by the voltage adjustment means 30, the operation of the switch means 11 is performed without causing unnecessary change to occur in the gate-to-emitter voltage Vge. According to the operation, the IGBT 1 is driven in the state in which the capacity of the capacitor between the gate and emitter of the IGBT 1 is increased. Since the capacitor is between the gate and emitter of the IGBT 1, if the IGBT 1 is driven with the same gate resistor, the decrease rate of the gate-to-emitter voltage Vge is lessened as the capacity of the capacitor between the gate and emitter of the IGBT 1 is larger, producing a similar effect of increasing the gate resistance value. As a result, the semiconductor device drive circuit of the fifth embodiment can drive the IGBT 1 at high speed for decreasing switching loss P in the first period not involved in the voltage surge and drive the IGBT 1 at low speed for suppressing the voltage surge in the second period involved in the voltage surge.

FIGS. 8B and 8C show configuration examples of the voltage adjustment means 30. In FIG. 8B, a voltage buffer 30a is used to form the voltage adjustment means 30; in FIG. 8C, a resistor 30b is used to form the voltage adjustment means 30. The operation is clear and will not be discussed in detail.

Sixth Embodiment

FIGS. 9A to 9D show configurations of current decrease start point detection means 14 in a sixth embodiment of the invention. In the figure, numeral 25 is voltage detection means, numeral 26 is a reference voltage source, and numeral 27 is comparison means. Other circuit parts are identical with those of the semiconductor device drive circuit in the prior art in FIG. 18 or those of the first embodiment in FIG. 1 and therefore will not be discussed again.

Figure 9A:
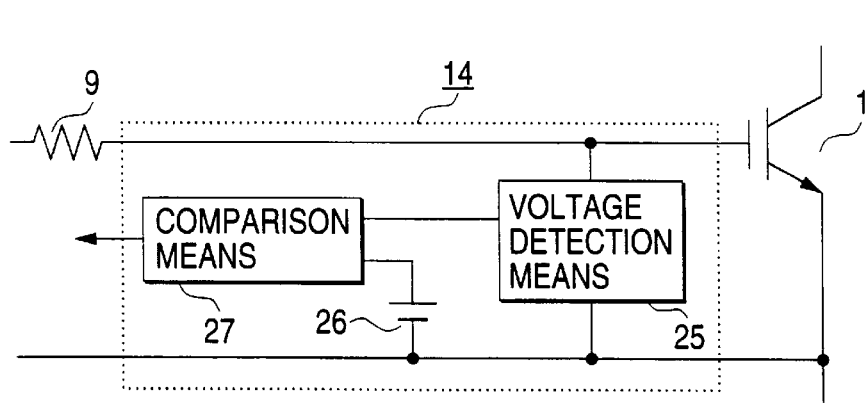
FIGS. 9A to 9D are circuit diagrams to show current decrease start point detection means according to a sixth embodiment of the invention.
Figure 10:
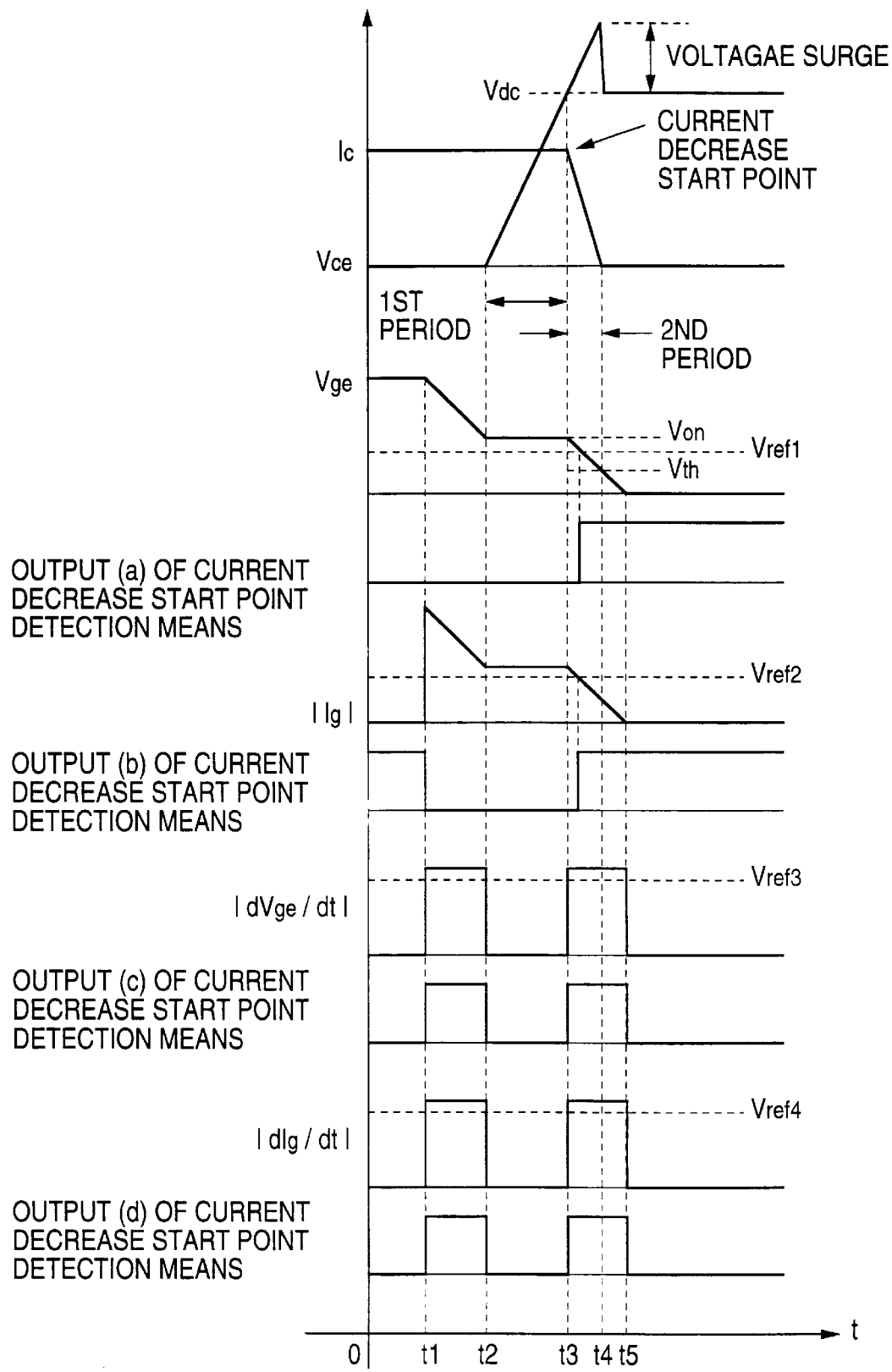
FIG. 10 is a waveform chart to explain the operation of current decrease start point detection means according to sixth to ninth embodiments of the invention.

Next, the operation will be discussed with reference to FIGS. 9A and 10. FIG. 10 shows voltage and current waveforms when an IGBT 1 is turned off. In the sixth embodiment, attention is focused on gate-to-emitter voltage Vge. The waveform of the gate-to-emitter voltage Vge is the same as that in the first embodiment and will not be discussed in detail. The voltage detection means 25 is connected between the gate and emitter of the IGBT 1 for detecting the gate-to-emitter voltage Vge in FIG. 10. The comparison means 27 compares output of the voltage detection means 25 with reference voltage Vref1 of the reference voltage source 26. When the gate-to-emitter voltage Vge is smaller than the reference voltage Vref1, the comparison means 27 outputs a high signal; when the gate-to-emitter voltage Vge is larger than the reference voltage Vref1, the comparison means 27 outputs a low signal. At this time, if the reference voltage Vref1 is set between voltage Von required for causing load current IL to flow and threshold value Vth of the IGBT 1, when the first period in which the gate-to-emitter voltage Vge becomes almost constant is terminated and the second period in which the gate-to-emitter voltage Vge starts to decrease toward 0 is entered, the low-to-high state transition of the signal is made. This operation can provide the signal which is low in the first period in which change of collector current Ic is moderate, and is high in the second period in which change of the collector current Ic is abrupt, as shown in FIG. 10A.

Figure 9B:
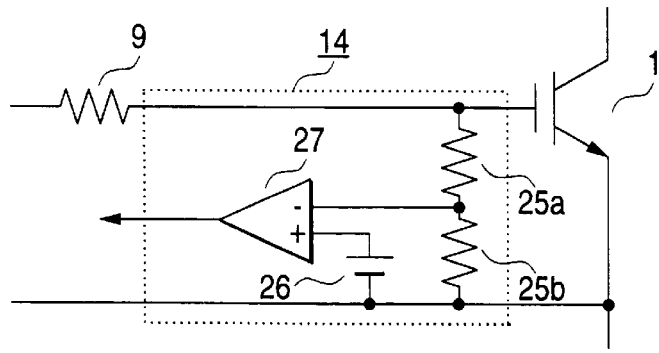
Figure 9C:
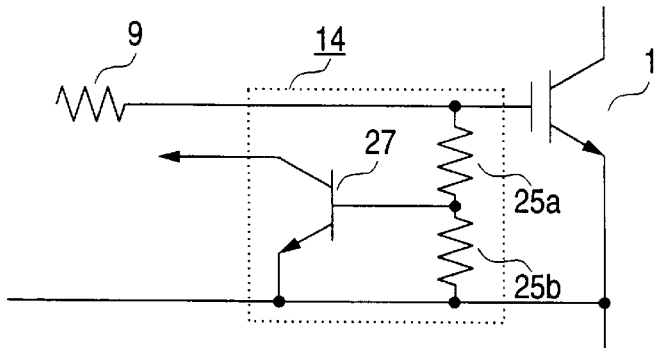
Figure 9D:
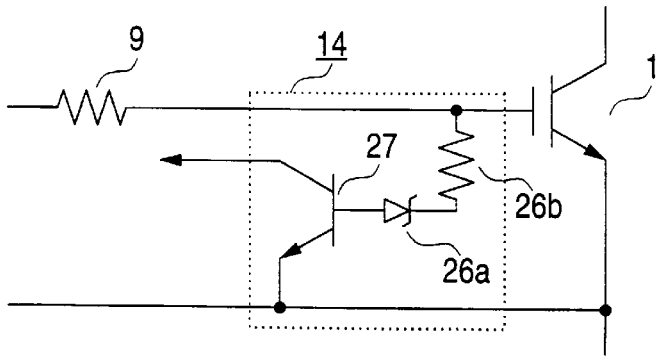

FIGS. 9B, 9C, and 9D show other configuration examples of the current decrease start point detection means 14. In FIG. 9B, the voltage detection means 25 is made up of resistors 25a and 25b for dividing and detecting the gate-to-emitter voltage Vge of the IGBT 1. A comparator 27 compares output of the voltage detection means 25 with the voltage of the reference voltage source 26. When the gate-to-emitter voltage Vge is lower than the reference voltage Vref1, the comparator 27 outputs a high signal; when the gate-to-emitter voltage Vge is higher than the reference voltage Vref1, the comparator 27 outputs a low signal. In FIG. 9(c), the voltage detection means 25 is made up of resistors 25a and 25b for dividing and detecting the gate-to-emitter voltage Vge of the IGBT 1. The detected voltage is input to a base of a transistor 27. If the detected voltage exceeds a base-to-emitter threshold value of the transistor 27, the transistor 27 is turned on, thus outputting a low signal. If the detected voltage does not exceed the base-to-emitter threshold value of the transistor 27, the transistor 27 is turned off, thus outputting a high signal. In FIG. 9D, the voltage detection means 25 comprises the transistor 27 having the base connected via a Zener diode 26a and resistor 26b to the gate of the IGBT 1. If the gate-to-emitter voltage Vge exceeds the sum voltage of the Zener voltage of the Zener diode 26a and the base-to-emitter threshold value of the transistor 27, the transistor 27 is turned on, thus outputting a low signal. If the gate-to-emitter voltage Vge does not exceed the sum voltage of the Zener voltage of the Zener diode 26a and the base-to-emitter threshold value of the transistor 27, the transistor 27 is turned off, thus outputting a high signal. The operation in FIGS. 9B, 9C, 9D is basically the same as that in FIG. 9A and will not be discussed in detail.

Seventh Embodiment

Figure 11A:
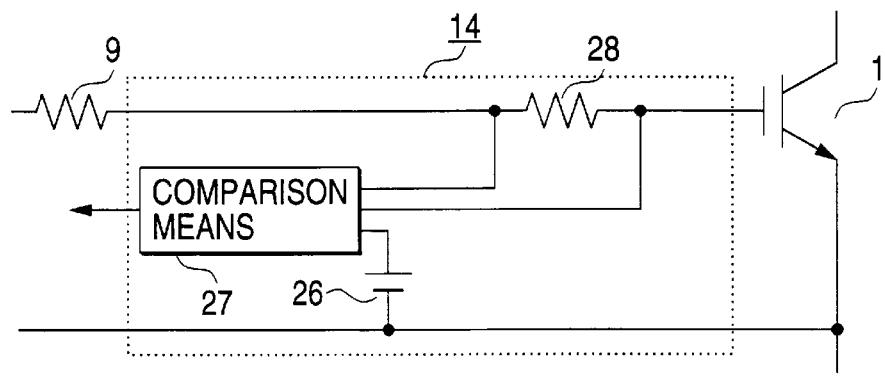
FIGS. 11A to 11C are circuit diagrams to show the current decrease start point detection means according to a seventh embodiment of the invention.
Figure 11B:
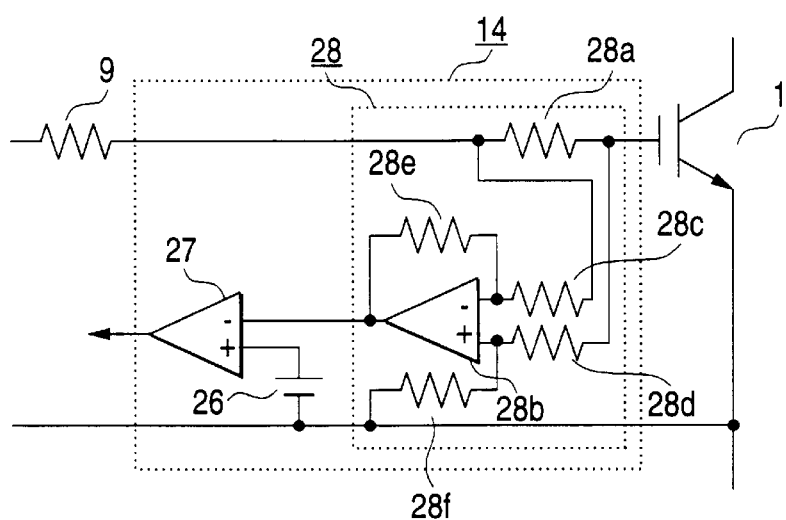
Figure 11C:
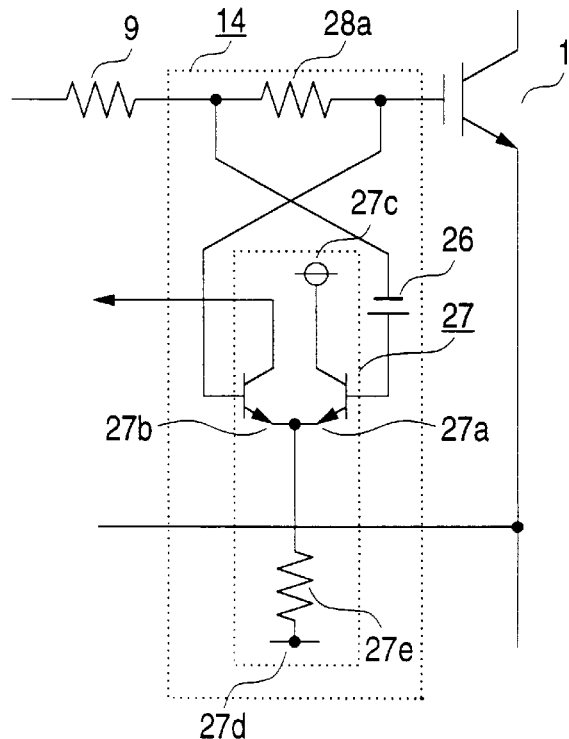

FIGS. 11A to 11C show configurations of current decrease start point detection means 14 in a seventh embodiment of the invention. In the figure, numeral 28 is current detection means, numeral 26 is a reference voltage source, and numeral 27 is comparison means. Other circuit parts are identical with those of the semiconductor device drive circuit in the prior art in FIG. 18 or those of the first embodiment in FIG. 1 and therefore will not be discussed again.

Next, the operation will be discussed with reference to FIGS. 11A and 10. FIG. 10 shows voltage and current waveforms when an IGBT 1 is turned off. In the seventh embodiment, attention is focused on gate current Ig. The waveform of the gate current Ig (absolute value) is the same as that in the first embodiment and will not be discussed in detail. The current detection means 28 is connected to the gate of the IGBT 1 in series for detecting the gate current Ig in FIG. 10. The comparison means 27 compares output of the current detection means 28 with reference voltage Vref2 of the reference voltage source 26. When the detection value of the gate current Ig is smaller than the reference voltage Vref2, the comparison means 27 outputs a high signal; when the detection value of the gate current Ig is larger than the reference voltage Vref2, the comparison means 27 outputs a low signal. At this time, if the reference voltage Vref2 is set between a current value resulting from dividing voltage Von required for causing load current IL to flow by a gate resistor 9 and zero, when the first period in which the gate current Ig becomes almost constant is terminated and the second period in which the gate current Ig starts to decrease toward 0 is entered, the low-to-high state transition of the signal is made. This operation can provide the signal which is low in the first period in which change of collector current Ic is moderate, and is high in the second period in which change of the collector current Ic is abrupt, as shown in FIG. 10.

FIGS. 11B and 11C show other configuration examples of the current decrease start point detection means 14. In FIG. 11B, the current detection means 28 is made up of a detection resistor 28a and a differential amplifier consisting of an operational amplifier 28b and resistors 28c to 28f. A comparator 27 compares output of the current detection means 28 with the voltage of the reference voltage source 26. When the detection value of the gate current Ig is smaller than the reference voltage Vref2, the comparator 27 outputs a high signal; when the detection value of the gate current Ig is larger than the reference voltage Vref2, the comparator 27 outputs a low signal. In FIG. 11C, the current detection means 28 is made of a detection resistor 28a and the comparator 27 is made up of transistors 27a and 27b, DC power sources 27c and 27d, and a resistor 27e. The comparator 27 compares output of the current detection resistor 28a with the voltage of the reference voltage source 26. When the detection value of the gate current Ig is smaller than the reference voltage Vref2, the comparator 27 outputs a high signal; when the detection value of the gate current Ig is larger than the reference voltage Vref2, the comparator 27 outputs a low signal.

The operation in FIGS. 11B and 11C basically is the same as that in FIG. 11A and will not be discussed in detail.

Eighth Embodiment

Figure 12A:
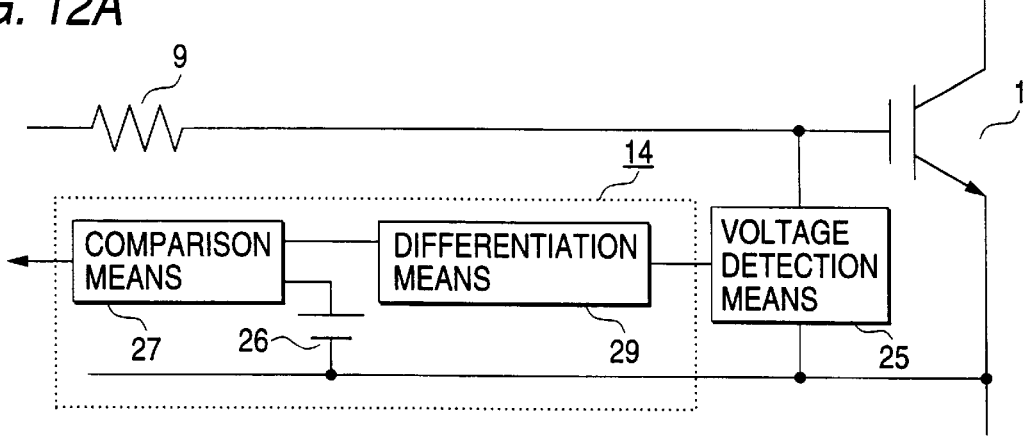
FIGS. 12A to 12C are circuit diagrams to show the current decrease start point detection means according to an eighth embodiment of the invention.
Figure 12B:
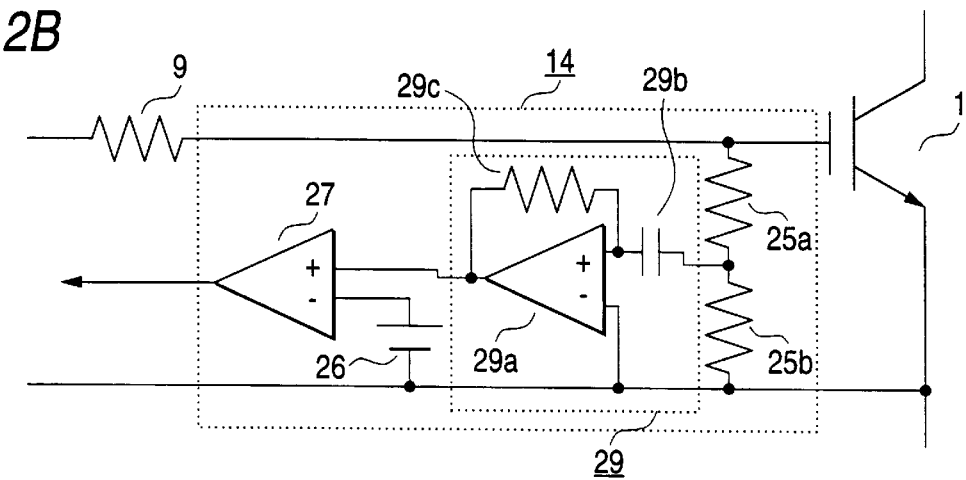
Figure 12C:
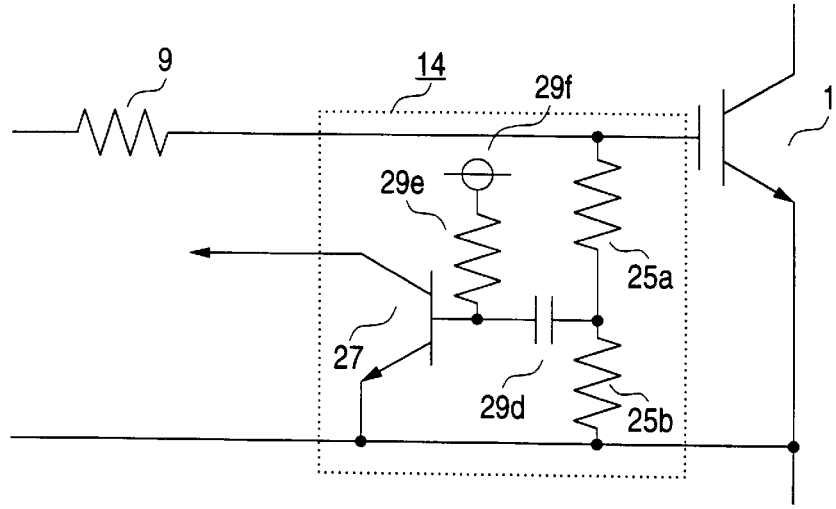

FIGS. 12A to 12C show configurations of current decrease start point detection means 14 in an eighth embodiment of the invention. In the figure, numeral 25 is voltage detection means, numeral 26 is a reference voltage source, numeral 27 is comparison means, and numeral 29 is differentiation means. Other circuit parts are identical with those of the semiconductor device drive circuit in the prior art in FIG. 18 or those of the first embodiment in FIG. 1 and therefore will not be discussed again.

Next, the operation will be discussed with reference to FIGS. 12A and 10. FIG. 10 shows voltage and current waveforms when an IGBT 1 is turned off. In the eighth embodiment, attention is focused on the change rate of gate-to-emitter voltage Vge (absolute value). The waveform of the gate-to-emitter voltage Vge is the same as that in the first embodiment and will not be discussed in detail. The voltage detection means 25 is connected between the gate and emitter of the IGBT 1 for detecting the gate-to-emitter voltage Vge in FIG. 10. The differentiation means 29 differentiates output of the voltage detection means 25 for providing a waveform of dVge/dt shown in FIG. 10. The comparison means 27 compares output of the differentiation means 29 with reference voltage Vref3 of the reference voltage source 26. When the derivative value dVge/dt of the gate-to-emitter voltage Vge is smaller than the reference voltage Vref3, the comparison means 27 outputs a high signal; when the derivative value dVge/dt of the gate-to-emitter voltage Vge is larger than the reference voltage Vref3, the comparison means 27 outputs a low signal. At this time, the gate-to-emitter voltage Vge is almost constant in the first period, thus the derivative value dVge/dt of the gate-to-emitter voltage Vge becomes almost 0. In the second period, the gate-to-emitter voltage Vge decreases toward 0 according to a time constant determined by a gate resistor 9 and the capacity of a gate-to-emitter capacitor of the IGBT 1, thus the derivative value dVge/dt of the gate-to-emitter voltage Vge has a negative value. Therefore, if the reference voltage Vref3 is set properly, when the first period in which the gate-to-emitter voltage Vge becomes almost constant is terminated and the second period in which the gate-to-emitter voltage Vge starts to decrease toward 0 is entered, the low-to-high state transition of the signal is made. This operation can provide the signal which is low in the first period in which change of collector current Ic is moderate, and is high in the second period in which change of the collector current Ic is abrupt, as shown in FIG. 10.

FIGS. 12B and 12C show other configuration examples of the current decrease start point detection means 14. In FIG. 12B, the voltage detection means 25 is made up of resistors 25a and 25b for dividing and detecting the gate-to-emitter voltage Vge of the IGBT 1. Output of the voltage detection means 25 is differentiated by a differentiation circuit 29 consisting of an operational amplifier 29a, a capacitor 29b, and a resistor 29c. A comparator 27 compares output of the differentiation circuit 29 with the voltage of the reference voltage source 26. When the derivative value dVge/dt of the gate-to-emitter voltage Vge is smaller than the reference voltage Vref3, the comparator 27 outputs a low signal; when the derivative value dVge/dt of the gate-to-emitter voltage Vge is larger than the reference voltage Vref3, the comparator 27 outputs a high signal. In FIG. 12C, the voltage detection means 25 is made up of resistors 25a and 25b for dividing and detecting the gate-to-emitter voltage Vge of the IGBT 1. The detected voltage is input to a base of a transistor 27 via a capacitor 29d. A bias current is caused to flow into the base of the transistor 27 via a resistor 29e from a power source 29f. Thus, if the charge/discharge current of the capacitor 29d flowing in proportion to the derivative value of the detected voltage is larger than the bias current, the transistor 27 is turned off, thus outputting a high signal. If the charge/discharge current of the capacitor 29d is smaller than the bias current, the transistor 27 is turned on, thus outputting a low signal. The operation in FIGS. 12B and 12C basically is the same as that in FIG. 12A and will not be discussed in detail.

Ninth Embodiment

Figure 13A:
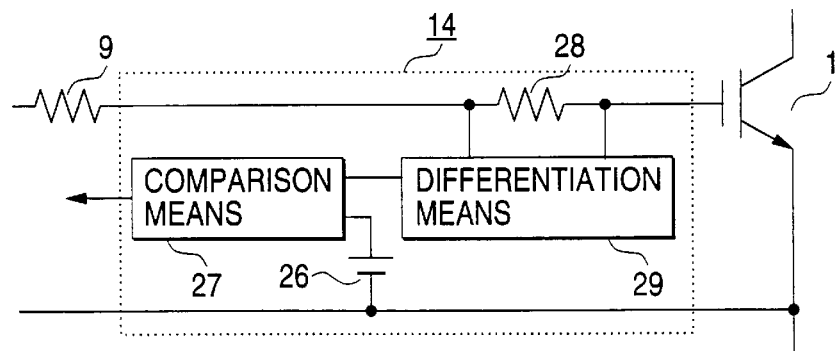
FIGS. 13A to 13C are circuit diagrams to show the current decrease start point detection means according to a ninth embodiment of the invention.
Figure 13B:
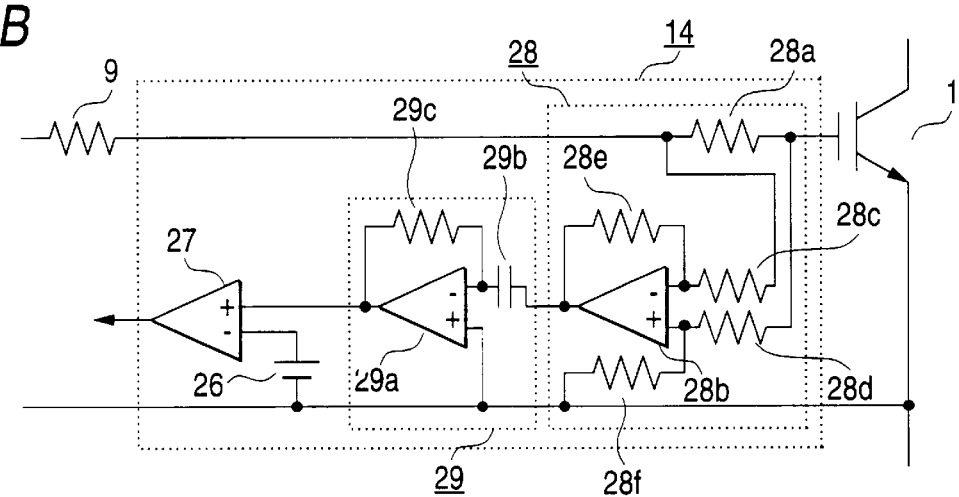
Figure 13C:
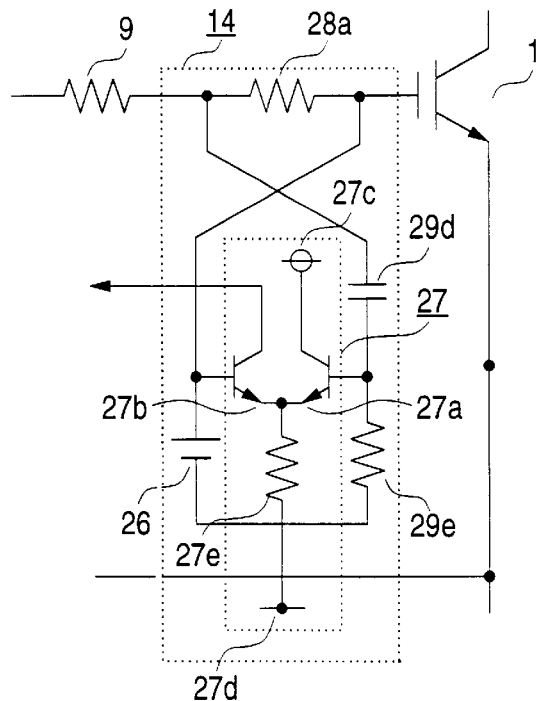

FIGS. 13A and 13C show configurations of current decrease start point detection means 14 in a ninth embodiment of the invention. In the figure, numeral 28 is current detection means, numeral 26 is a reference voltage source, numeral 27 is comparison means, and numeral 29 is differentiation means. Other circuit parts are identical with those of the semiconductor device drive circuit in the prior art in FIG. 18 or those of the first embodiment in FIG. 1 and therefore will not be discussed again.

Next, the operation will be discussed with reference to FIGS. 13A and 10. FIG. 10 shows voltage and current waveforms when an IGBT 1 is turned off. In the seventh embodiment, attention is focused on the change rate of gate current Ig (absolute value). The waveform of the gate current Ig (absolute value) is the same as that in the first embodiment and will not be discussed in detail. The current detection means 28 is connected to the gate of the IGBT 1 in series for detecting the gate current Ig in FIG. 10. The differentiation means 29 differentiates output of the current detection means 28 for providing a waveform of dIg/dt shown in FIG. 10. The comparison means 27 compares output of the differentiation means 29 with reference voltage Vref4 of the reference voltage source 26. When the derivative value dIg/dt of the gate current Ig is smaller than the reference voltage Vref4, the comparison means 27 outputs a low signal; when the derivative value dIg/dt of the gate current Ig is larger than the reference voltage Vref4, the comparison means 27 outputs a high signal. At this time, the gate current Ig is almost constant in the first period, thus the derivative value dIg/dt of the gate current Ig becomes almost 0. In the second period, the gate current Ig decreases toward 0 according to a time constant determined by a gate resistor 9 and the capacity of a gate-to-emitter capacitor of the IGBT 1, thus the derivative value dIg/dt of the gate current Ig has a negative value. Therefore, if the reference voltage Vref4 is set properly, when the first period in which the gate current Ig becomes almost constant is terminated and the second period in which the gate current Ig starts to decrease toward 0 is entered, the low-to-high state transition of the signal is made. This operation can provide the signal which is low in the first period in which change of collector current Ic is moderate, and is high in the second period in which change of the collector current Ic is abrupt, as shown in FIG. 10.

FIGS. 13B and 13C show other configuration examples of the current decrease start point detection means 14. In FIG. 13B, the current detection means 28 is made up of a detection resistor 28a and a differential amplifier consisting of an operational amplifier 28b and resistors 28c to 28f. Output of the current detection means 28 is differentiated by a differentiation circuit 29 consisting of an operational amplifier 29a, a capacitor 29b, and a resistor 29c. A comparator 27 compares output of the differentiation circuit 29 with the voltage of the reference voltage source 26. When the change rate of the gate current Ig is smaller than the reference voltage Vref4, the comparator 27 outputs a low signal; when the change rate of the gate current Ig is larger than the reference voltage Vref4, the comparator 27 outputs a high signal. In FIG. 13C, the current detection means 28 is made of a detection resistor 28a and the comparator 27 is made up of transistors 27a and 27b, DC power sources 27c and 27d, and a resistor 27e. Output of the current detection resistor 28a is connected to a base of the transistor 27a via a capacitor 29d and a closed loop consisting of the current detection resistor 28a, the resistor 29e, and the reference voltage source 26 is made. Thus, the gate current derivative value is input to the base of the transistor 27a. The reference voltage source 26 is connected to a base of the transistor 27b. Thus, if the derivative value of the detected voltage is larger than the reference voltage Vref4, the transistor 27b is turned off, thus outputting a high signal. If the derivative value of the detected voltage is smaller than the reference voltage Vref4, the transistor 27b is turned on, thus outputting a low signal. The operation in FIGS. 13B and 13C basically is the same as that in FIG. 13A and will not be discussed in detail.

Tenth Embodiment

Figure 14:
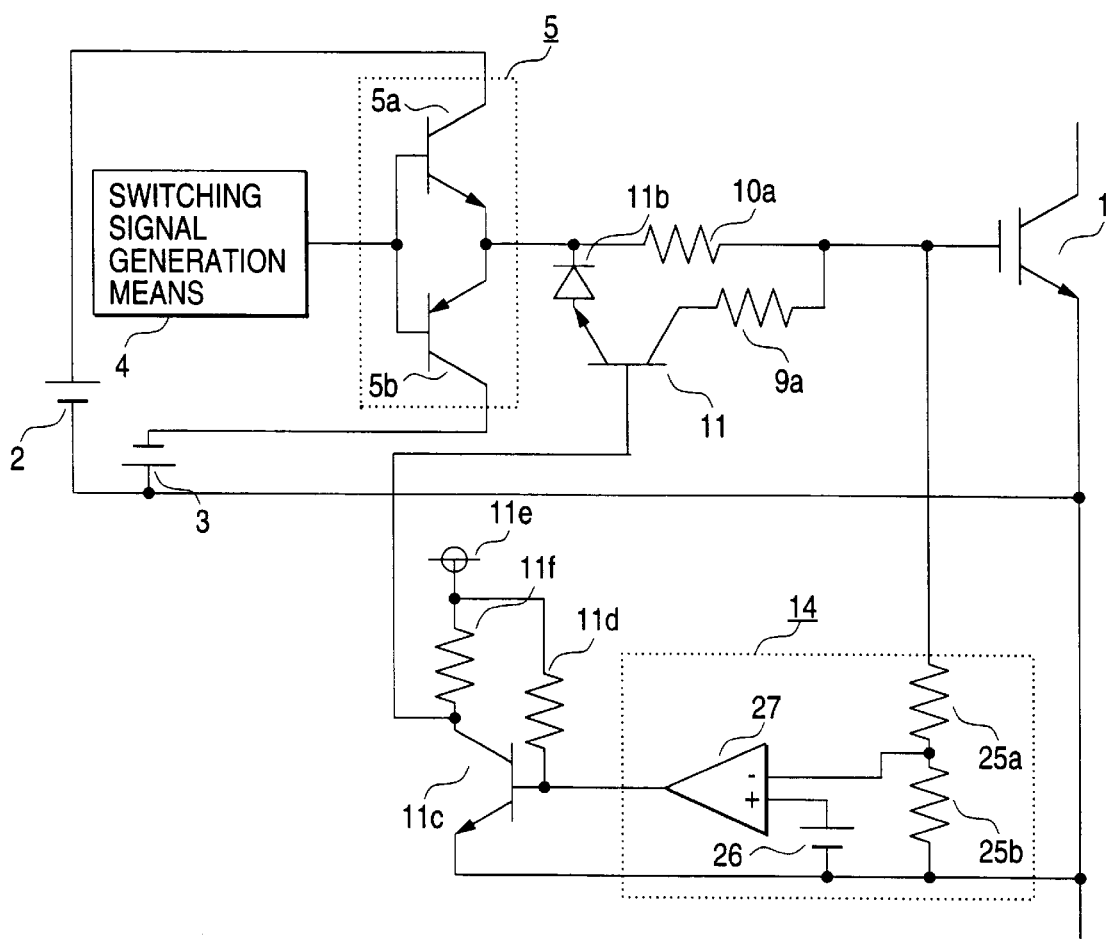
FIG. 14 is a circuit diagram to show a semiconductor device drive circuit according to a tenth embodiment of the invention.

FIG. 14 shows the configuration of a tenth embodiment of the invention. The tenth embodiment comprises the second embodiment in FIG. 5B and the sixth embodiment in FIG. 9B in combination. In FIG. 14, numerals 5a and 5b are transistors making up on/off switch means 5. Numeral 11a is a transistor and numeral 11b is a diode, which make up a switch part of switch means 11. Numeral 11c is a transistor, numeral 11d is a resistor, numeral 11e is a power source, and numeral 11f is a resistor, which make up a drive part of the switch of the switch means 11. The drive part of the switch of the switch means 11 forms a logic inversion circuit for matching logic between output of current decrease start point detection means 14 and input of the switch part of the switch means 11. Other circuit parts are identical with those of the second embodiment in FIG. 5B and those of the sixth embodiment in FIG. 9B and therefore will not be discussed again.

Next, the operation will be discussed. When switching signal generation means 4 outputs an on signal, the transistor 5a is turned on and the transistor 5b is turned off for applying a voltage of an on-DC voltage source 2 via a second gate resistor 10 to a gate of an IGBT 1, turning on the IGBT 1. Next, when the switching signal generation means 4 outputs an off signal, the transistor 5a is turned off and the transistor 5b is turned on for applying a voltage of an off-DC voltage source 3 via the second gate resistor 10 or a resultant resistor of the second gate resistor 10 and a register 9a to the gate of the IGBT 1, turning off the IGBT 1. At this time, in the first period in which change of collector current Ic is moderate, as described in the sixth embodiment, the detection value of gate-to-emitter voltage Vge of the IGBT 1 divided and detected by resistors 25a and 25b is larger than the voltage of a reference voltage source 26, thus a comparator 27 outputs a low signal. Thus, the transistor 11c is turned off, causing a current to flow into a base of the transistor 11a from the power source 11e via the resistor 11f, turning on the transistor 11a. Therefore, the resultant resistor of the second gate resistor 10 and the register 9a is used as the gate resistor. In the second period in which change of the collector current Ic is abrupt, as described in the sixth embodiment, the detection value of the gate-to-emitter voltage Vge of the IGBT 1 divided and detected by the resistors 25a and 25b is smaller than the voltage of the reference voltage source 26, thus a comparator 27 outputs a high signal. Thus, the transistor 11c is turned on, stopping current supply to the base of the transistor 11a, turning off the transistor 11a. Therefore, only the second gate resistor 10 is used as the gate resistor. As a result, the semiconductor device drive circuit of the tenth embodiment can drive the IGBT 1 at high speed with the low gate resistor for decreasing switching loss P in the first period not involved in the voltage surge and drive the IGBT 1 at low speed with the high gate resistor for suppressing the voltage surge in the second period involved in the voltage surge.

We have discussed the tenth embodiment provided by combining the second and sixth embodiments. As seen from the description of the first to ninth embodiments, the first to fifth embodiments are equivalent in function and the sixth to ninth embodiments are equivalent in function. Thus, any one of the first to fifth embodiments and any one of the sixth to ninth embodiments can be used in combination for performing the operation similar to that of the tenth embodiment as a combination of the second and sixth embodiments. The operation of each pair of the embodiments will not be discussed.

Eleventh Embodiment

Figure 15:
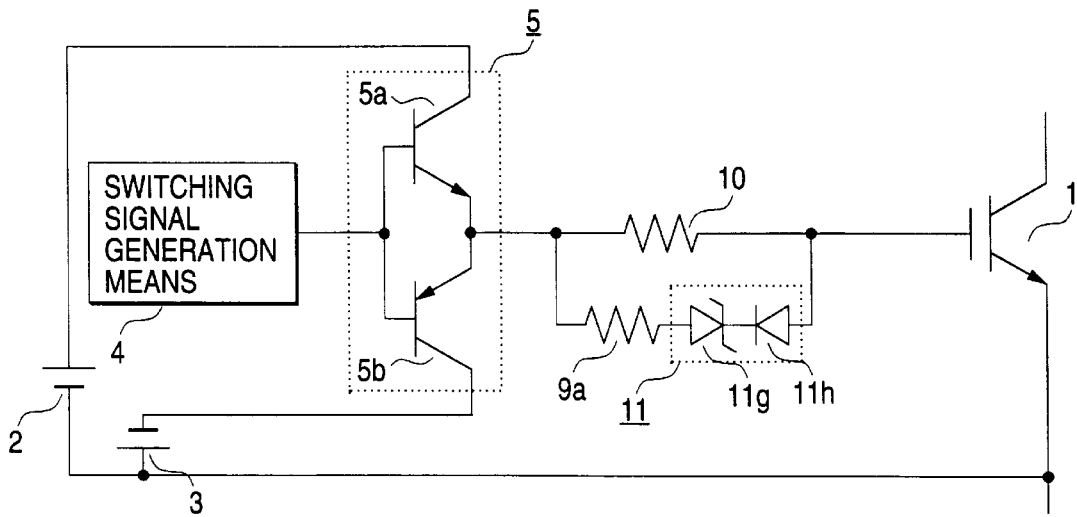
FIG. 15 is a circuit diagram to show a semiconductor device drive circuit according to an eleventh embodiment of the invention.

FIG. 15 shows the configuration of an eleventh embodiment of the invention. In the figure, numeral 11g is a Zener diode and numeral 11h is a diode. Other circuit parts are identical with those of the tenth embodiment in FIG. 14 and therefore will not be discussed again.

Next, the operation will be discussed. When switching signal generation means 4 outputs an on signal, a transistor 5a is turned on and a transistor 5b is turned off for applying a voltage of an on-DC voltage source 2 via a second gate resistor 10 to a gate of an IGBT 1, turning on the IGBT 1. Next, when the switching signal generation means 4 outputs an off signal, the transistor 5a is turned off and the transistor 5b is turned on for applying a voltage of an off-DC voltage source 3 via the second gate resistor 10 or a resultant resistor of the second gate resistor 10 and a register 9a to the gate of the IGBT 1, turning off the IGBT 1. At this time, in the first period in which change of collector current Ic is moderate, as described in the sixth embodiment, Zener voltage is set so that gate-to-emitter voltage Vge of the IGBT 1 exceeds Zener voltage of the Zener diode 11g. At this time, the Zener diode 11g is turned on and the resultant resistor of the register 9a and the second gate resistor 10 is used as the gate resistor. In the second period in which change of the collector current Ic is abrupt, as described in the sixth embodiment, the gate-to-emitter voltage Vge of the IGBT 1 does not exceed the Zener voltage of the Zener diode 11g, thus the Zener diode 11g is turned off. Therefore, only the second gate resistor 10 is used as the gate resistor. As a result, the semiconductor device drive circuit of the eleventh embodiment can drive the IGBT 1 at high speed with the low gate resistor for decreasing switching loss P in the first period not involved in the voltage surge and drive the IGBT 1 at low speed with the high gate resistor for suppressing the voltage surge in the second period involved in the voltage surge.

Twelfth Embodiment

Figure 16:
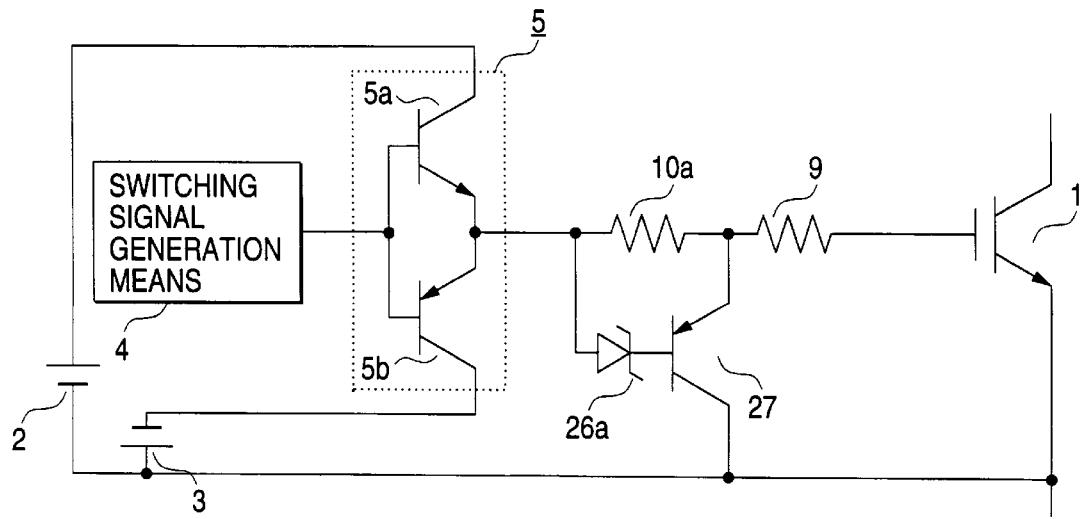
FIG. 16 is a circuit diagram to show a semiconductor device drive circuit according to a twelfth embodiment of the invention.

FIG. 16 shows the configuration of a twelfth embodiment of the invention. In the figure, numeral 9 is a first gate resistor and numeral 10a is a resistor connected in series for providing a resistance value equivalent to a second gate resistor 10. Other circuit parts are identical with those of the seventh embodiment in FIG. 11D and those of the tenth embodiment in FIG. 14 and therefore will not be discussed again.

Next, the operation will be discussed. When switching signal generation means 4 outputs an on signal, a transistor 5a is turned on and a transistor 5b is turned off for applying a voltage of an on-DC voltage source 2 via a resultant resistor of the first gate resistor 9 and the resistor 10a to a gate of an IGBT 1, turning on the IGBT 1. Next, when the switching signal generation means 4 outputs an off signal, the transistor 5a is turned off and the transistor 5b is turned on for applying a voltage of an off-DC voltage source 3 via the first gate resistor 9 or the resultant resistor of the first gate resistor 9 and the register 10a to the gate of the IGBT 1, turning off the IGBT 1. At this time, in the first period in which change of collector current Ic is moderate, as described in the seventh embodiment, Zener voltage is set so that a voltage drop occurring in the resistor 10a also serving detecting gate current Ig of the IGBT 1 exceeds Zener voltage of a Zener diode 26a. At this time, the Zener diode 26a is turned on, thus a transistor 27 is also turned on and only the first gate resistor 9 is used as the gate resistor. In the second period in which change of the collector current Ic is abrupt, as described in the seventh embodiment, a voltage drop occurring in the resistor 10a also serving detecting the gate current Ig of the IGBT 1 does not exceed the Zener voltage of the Zener diode 26a, thus the Zener diode 26a is turned off. Therefore, the transistor 27 is also turned off and the series resultant resistor of the first gate resistor 9 and the register 10a is used as the gate resistor. As a result, the semiconductor device drive circuit of the twelfth embodiment can drive the IGBT 1 at high speed with the low gate resistor for decreasing switching loss P in the first period not involved in the voltage surge and drive the IGBT 1 at low speed with the high gate resistor for suppressing the voltage surge in the second period involved in the voltage surge.

Thirteenth Embodiment

Figure 17:
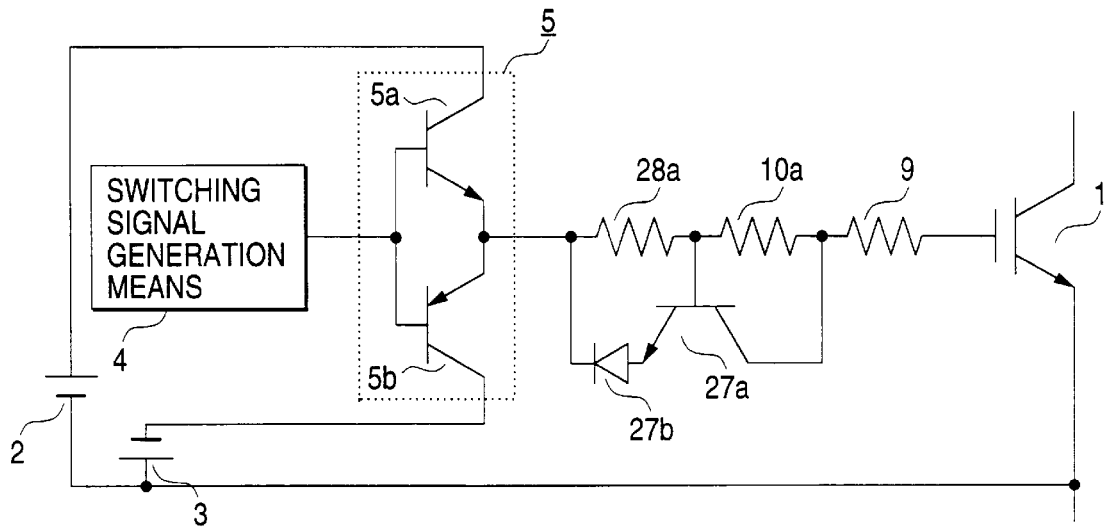
FIG. 17 is a circuit diagram to show a semiconductor device drive circuit according to a thirteenth embodiment of the invention.

FIG. 17 shows the configuration of a thirteenth embodiment of the invention. In the figure, numeral 27a is a transistor and numeral 27b is a diode. Other circuit parts are identical with those of the seventh embodiment in FIG. 11D and those of the twelfth embodiment in FIG. 6 and therefore will not be discussed again.

Next, the operation will be discussed. When switching signal generation means 4 outputs an on signal, a transistor 5a is turned on and a transistor 5b is turned off for applying a voltage of an on-DC voltage source 2 via a resultant resistor of a first gate resistor 9, a resistor 10a, and a current detection resistor 28a to a gate of an IGBT 1, turning on the IGBT 1. Next, when the switching signal generation means 4 outputs an off signal, the transistor 5a is turned off and the transistor 5b is turned on for applying a voltage of an off-DC voltage source 3 via the first gate resistor 9 or the resultant resistor of the first gate resistor 9, the register 10a, and the current detection resistor 28a to the gate of the IGBT 1, turning off the IGBT 1. At this time, in the first period in which change of collector current Ic is moderate, as described in the seventh embodiment, the current detection resistor 28a is set so that a voltage drop occurring in the current detection resistor 28a for detecting gate current Ig of the IGBT 1 exceeds the sum voltage of the base-to-emitter threshold voltage of the transistor 27a and the forward voltage of the diode 27b. At this time, the transistor 27a is turned on and only the first gate resistor 9 is used as the gate resistor. In the second period in which change of the collector current Ic is abrupt, as described in the seventh embodiment, a voltage drop occurring in the current detection resistor 28a for detecting the gate current Ig of the IGBT 1 does not exceed the sum voltage of the base-to-emitter threshold voltage of the transistor 27a and the forward voltage of the diode 27b, thus the transistor 27a is turned off. Therefore, the resultant resistor of the first gate resistor 9, the register 10a, and the current detection resistor 28a is used as the gate resistor. As a result, the semiconductor device drive circuit of the thirteenth embodiment can drive the IGBT 1 at high speed with the low gate resistor for decreasing switching loss P in the first period not involved in the voltage surge and drive the IGBT 1 at low speed with the high gate resistor for suppressing the voltage surge in the second period involved in the voltage surge.

As we have discussed, according to the invention, a semiconductor device drive circuit is connected to a control electrode of an insulated gate bipolar transistor for controlling the conduction state between main electrodes in response to a voltage applied to the control electrode, the semiconductor device drive circuit comprising first drive means for driving the insulated gate bipolar transistor, second drive means for driving the insulated gate bipolar transistor at lower speed than the first drive means, switching signal generation means for supplying a signal to the first drive means and the second drive means, switch means for switching output of the first drive means and output of the second drive means for supply to the control electrode, and current decrease start point detection means for detecting a current decrease start point when a transition is made from a first period in which change in a current flowing into the main electrodes is moderate to a second period in which current change is abrupt when a voltage of the control electrode is lowered for making a transition from a conduction state to a non-conduction state between the main electrodes. The switch means is operated so as to use the first drive means in the first period and the second drive means in the second period in response to output of the current decrease start point detection means. Therefore, the semiconductor device drive circuit can drive the IGBT 1 at high speed for decreasing the switching loss P in the first period not involved in the voltage surge and drive the IGBT 1 at low speed for suppressing the voltage surge in the second period involved in the voltage surge. Thus, the semiconductor device drive circuit enables both suppression of the voltage surge and a decrease in the switching loss. Since the operation does not depend on the characteristics of the IGBT 1, the semiconductor device drive circuit can be applied to every IGBT.

What is claimed is:

1. A semiconductor device driving circuit being connected to a control electrode of an insulated gate bipolar transistor for controlling a conduction state between main electrodes thereof in response to a voltage applied to the control electrode, said semiconductor device drive circuit comprising:

driving control means for driving the insulated gate bipolar transistor at higher driving speed and lower driving speed, the output of the driving means being supplied to the control electrode of the insulated gate bipolar transistor for controlling a conduction state; and current decrease start point detection means, connected to said driving control means, for detecting a current decrease start point when a transition is made from a first period in which change in a current flowing into the main electrodes is at a first level to a second period in which a change in current is at a second higher level when a voltage of the control electrode is lowered for making a transition from a conduction state to a non-conduction state between the main electrodes;

wherein said driving control means outputs at the higher driving speed in the first period and outputs at lower the driving speed in the second period in response to output of said current decrease start point detection means.

2. The semiconductor device driving circuit as claimed in claim 1, wherein said driving control means comprises:

first drive means for driving the insulated gate bipolar transistor;

second drive means for driving the insulated gate bipolar transistor at lower speed than said first drive means;

switching signal generation means for supplying a signal to said first drive means and said second drive means; and switch means for an switching an output of said first drive means and output of said second drive means for supply to an the control electrode;

wherein said switch means is operated so as to use said first drive means in the first period and said second drive means in the second period in response to output of said current decrease start point detection means.

3. The semiconductor device driving circuit as claimed in claim 1, wherein said driving control means comprises:

an on-DC voltage source for supplying an on voltage to the control electrode;

an off-DC voltage source for supplying an off voltage to the control electrode;

on/off switch means for switching said on-DC voltage source and said off-DC voltage source;

switching signal generation means for supplying a signal to said on/off switch means;

a first gate resistor being connected to said on/off switch means;

a second gate resistor being connected to said on/off switch means and having a resistance value larger than said first gate resistor; and switch means for switching said first gate resistor and said second gate resistor for connection to the control electrode;

wherein said switch means is operated so as to use said first gate resistor in the first period and said second gate resistor in the second period in response to output of said current decrease start point detection means.

4. The semiconductor device driving circuit as claimed in claim 1, wherein said driving control means comprises:

an on-DC voltage source for supplying an on voltage to the control electrode;

a first off-DC voltage source for supplying an off voltage to the control electrode;

a second off-DC voltage source for supplying an off voltage to the control electrode and having a voltage smaller than said first off-DC voltage source;

switch means for switching said first off-DC voltage source and said second off-DC voltage source;

on/off switch means for switching said on-DC voltage source and output of said switch means, switching signal generation means for supplying a signal to said on/off switch means; and a gate resistor being connected between said on/off switch means and the control electrode;

wherein said switch means is operated so as to use said first off-DC voltage source in the first period and said second off-DC voltage source in the second period in response to output of said current decrease start point detection means.

5. The semiconductor device driving circuit as claimed in claim 1, wherein said driving control means comprises:

an on-DC current source for causing a current to flow into the control electrode;

a first off-DC current source for drawing out a current from the control electrode;

a second off-DC current source for drawing out a current from the control electrode and having a current value smaller than said first off-DC current source;

switch means for switching said first off-DC current source and said second off-DC current source;

on/off switch means for switching output of said on-DC current source and output of said switch means; and switching signal generation means for supplying a signal to said on/off switch means;

wherein said switch means is operated so as to use said first off-DC current source in the first period and said second off-DC current source in the second period in response to output of said current decrease start point detection means.

6. The semiconductor device driving circuit as claimed in claim 1, wherein said driving control means comprises:

an on-DC voltage source for supplying an on voltage to the control electrode;

an off-DC voltage source for supplying an off voltage to the control electrode;

on/off switch means for switching said on-DC voltage source and said off-DC voltage source;

switching signal generation means for supplying a signal to said on/off switch means;

a gate resistor being connected between said on/off switch means and the control electrode;

switch means being connected to the control electrode;

a capacitor being connected between said switch means and one end of the main electrode; and voltage adjustment means being connected to said switch means in parallel;

wherein said switch means is operated so that the control electrode and said capacitor are connected in the second period in response to output of said current decrease start point detection means.

7. The semiconductor device drive circuit as claimed in claim 1 wherein said current decrease start point detection means comprises means for detecting a voltage of the control electrode of the insulated gate bipolar transistor, a reference voltage source, and means for comparing output of said voltage detection means with output of said reference voltage source.

8. The semiconductor device drive circuit as claimed in claim 1 wherein said current decrease start point detection means comprises means for detecting a current flowing through the control electrode of the insulated gate bipolar transistor, a reference voltage source, and means for comparing output of said current detection means with output of said reference voltage source.

9. The semiconductor device drive circuit as claimed in claim 1 wherein said current decrease start point detection means comprises means for detecting a voltage of the control electrode of the insulated gate bipolar transistor, means for differentiating an output of said voltage detection means, a reference voltage source, and means for comparing an output of said differentiation means with an output of said reference voltage source.

10. The semiconductor device drive circuit as claimed in claim 1 wherein said current decrease start point detection means comprises means for detecting a current flowing through the control electrode of the insulated gate bipolar transistor, means for differentiating an output of said current detection means, a reference voltage source, and means for comparing an output of said differentiation means with an output of said reference voltage source.

11. A semiconductor device driving circuit being connected to an insulated gate bipolar transistor having a control electrode and main electrodes, comprising:

a drive circuit connected to the control electrode of the insulated gate bipolar;

current rate change detection means, connected to the drive circuit, for detecting a change in the rate of current flowing into one of the main electrodes when a voltage applied to the control electrode is lowered for making a transition from a conduction state to a non-conduction state; and a switch circuit, connected to the drive circuit, and the means for switching between drive states of the drive circuit.

12. The semiconductor device driving circuit as claimed in claim 11, wherein the means comprises:

one of a voltage detector and a current detector connected to the control electrode;

a reference voltage source; and a comparator with a first input connected to the one of the voltage detector and the current detector and a second input connected to the reference voltage source.

13. The semiconductor device driving circuit as claimed in claim 11, wherein the means comprises:

one of a voltage detector and a current detector connected to the control electrode;

a reference voltage source;

a differentiator with a first input connected to the one of a voltage detector and a current detector; and a comparator with a first input connected to the differentiator and a second input connected to said reference voltage source.

14. A method of operating a drive circuit for driving an insulated gate bipolar transistor having a control electrode and main electrodes, comprising:

detecting a change in a rate of current flowing into one of the main electrodes; and switching between driving states of the drive circuit using the change;

wherein detecting the change comprises:

detecting one of a voltage of the control input and a current flowing into the control input; and differentiating one of the voltage of the control input and a voltage related to the current flowing in the control input to produce a differentiated voltage; and comparing the differentiated voltage to a reference voltage.

* * * * *